(12) United States Patent
Miyamoto et al.

(10) Patent No.: US 7,800,131 B2
(45) Date of Patent: Sep. 21, 2010

(54) FIELD EFFECT TRANSISTOR

(75) Inventors: Hironobu Miyamoto, Tokyo (JP); Yuji Ando, Tokyo (JP); Yasuhiro Okamoto, Tokyo (JP); Tatsuo Nakayama, Tokyo (JP); Takashi Inoue, Tokyo (JP); Kazuki Ota, Tokyo (JP); Akio Wakejima, Tokyo (JP); Kensuke Kasahara, Tokyo (JP); Yasuhiro Murase, Tokyo (JP); Kohji Matsunaga, Tokyo (JP); Katsumi Yamanoguchi, Tokyo (JP); Hidenori Shimawaki, Tokyo (JP)

(73) Assignee: NEC Corporation, Tokyo (JP)

( * ) Notice: Subject to any disclaimer, the term of this patent is extended or adjusted under 35 U.S.C. 154(b) by 164 days.

(21) Appl. No.: 11/921,857

(22) PCT Filed: Jun. 12, 2006

(86) PCT No.: PCT/JP2006/311746

§ 371 (c)(1),
(2), (4) Date: Dec. 24, 2007

(87) PCT Pub. No.: WO2006/132419

PCT Pub. Date: Dec. 14, 2006

(65) Prior Publication Data

US 2009/0230430 A1    Sep. 17, 2009

(30) Foreign Application Priority Data

Jun. 10, 2005    (JP)    ............................. 2005-171700

(51) Int. Cl.
  *H01L 29/812*    (2006.01)
  *H01L 21/338*    (2006.01)
(52) U.S. Cl. ............... 257/192; 257/194; 257/E29.246; 257/E29.247; 257/E21.403; 257/E21.407

(58) Field of Classification Search .................. 257/192, 257/194, E29.255, E29.246–29.247, E21.407
See application file for complete search history.

(56) References Cited

U.S. PATENT DOCUMENTS 6,100,571 A * 8/2000 Mizuta et al. ............... 257/488

(Continued)

FOREIGN PATENT DOCUMENTS

JP    1-96966 A    4/1989

(Continued)

OTHER PUBLICATIONS

Asano et al., "Novel High Power AlGaAs/GaAs HFET with a Field-Modulated Plate Operated at 35V Drain Voltage," IEDM, vol. 98, pp. 59-62 (1998).

(Continued)

*Primary Examiner*—Zandra Smith
*Assistant Examiner*—Jeremy J Joy
(74) *Attorney, Agent, or Firm*—Young & Thompson

(57) ABSTRACT

A field effect transistor includes a layer structure made of compound semiconductor (111) provided on a semiconductor substrate (110) made of GaAs or InP, as an operation layer, and employs a first field plate electrode (116) and a second field plate electrode (118). The second field plate electrode includes a shielding part (119) located in the region between the first field plate electrode and a drain electrode (114), and serves to shield the first field plate electrode from the drain electrode. When, in the cross sectional view in the gate length direction, the length in the gate length direction of an overlap region, in which the second field plate electrode overlaps the upper part of a structure composed of the first field plate electrode and a gate electrode (113), is designated as Lol, and the gate length is Lg, the relation expressed as $0 \leq Lol/Lg \leq 1$ holds.

17 Claims, 14 Drawing Sheets

U.S. PATENT DOCUMENTS

| | | | |
|---|---|---|---|
| 6,933,544 B2 * | 8/2005 | Saito et al. | 257/194 |
| 7,573,078 B2 * | 8/2009 | Wu et al. | 257/194 |
| 2002/0171096 A1 | 11/2002 | Wakejima et al. | |
| 2005/0051796 A1 * | 3/2005 | Parikh et al. | 257/192 |
| 2005/0062069 A1 | 3/2005 | Saito et al. | |
| 2005/0253167 A1 * | 11/2005 | Wu et al. | 257/192 |
| 2005/0253168 A1 * | 11/2005 | Wu et al. | 257/192 |
| 2006/0043415 A1 * | 3/2006 | Okamoto et al. | 257/192 |
| 2006/0102929 A1 * | 5/2006 | Okamoto et al. | 257/189 |
| 2007/0235761 A1 * | 10/2007 | Parikh et al. | 257/194 |

FOREIGN PATENT DOCUMENTS

| | | |
|---|---|---|
| JP | 2000-3919 A | 1/2000 |
| JP | 3111985 | 9/2000 |
| JP | 3180776 | 4/2001 |
| JP | 2001-230263 | 8/2001 |
| JP | 2001-237250 | 8/2001 |
| JP | 2002-343814 A | 11/2002 |
| JP | 2002-353444 | 12/2002 |
| JP | 2004-200248 A | 7/2004 |
| JP | 2004-327919 | 11/2004 |
| JP | 2005-93864 A | 4/2005 |
| WO | WO 2004061978 A1 * | 7/2004 |
| WO | 2005/024909 | 3/2005 |

OTHER PUBLICATIONS

Huili Xing et al., IEEE Electron device Letters, vol. 25, No. 4, pp. 161-163 (2004).

S. Mil'shtein, Microelectronics journal, vol. 36, pp. 319-322 (2005) (published online Apr. 19, 2005).

W. Saito et al., Japanese Journal of Applied Physics, vol. 43, No. 4B, pp. 2239-2242 (2004).

Y.-F. Wu et al., IEEE Electron device Letters, vol. 25, No. 3, pp. 117-119 (2004).

S. Karmalkar and U.K. Mishra, Solid-State Electronics, vol. 45, pp. 1645-1652 (2001).

S. Karmalkar and U.K. Mishra, IEEE Transactions on Electron Devices, vol. 48, No. 8, pp. 1515-1521 (2001).

European Patent Office issued an European Search Report dated Jun. 23, 2009, Application No. 06766608.1.

Chinese Patent Office issued a Chinese Office Action dated Dec. 18, 2009, Application No. 200680029172.5.

Chinese Patent Office issued a Chinese Office Action dated Sep. 4, 2009, Application No. 200680029172.5.

* cited by examiner

Line of electric force (a)

(b)

| Lfd (μm) | 0 | 0.4 | 1.0 | 1.4 | 2.0 | 3.0 |
|---|---|---|---|---|---|---|
| Turning point (GHz) | 16 | 14 | 13 | 6 | 5 | 5 |

FIELD EFFECT TRANSISTOR

TECHNICAL FIELD

The present invention relates to a field effect transistor. In particular, the present invention relates to a structure for attaining excellent high frequency characteristic and high voltage performance in a hetero-junction field effect transistor utilizing III-V compound semiconductor provided on a semiconductor substrate made of GaAs or InP.

RELATED ART

As a Field Effect Transistor (hereinafter referred to as "FET" as occasion may demand) using compound semiconductor, there conventionally exists a FET as shown in FIG. 17 (Non-Patent Document 1: K. Asano, et al., 1998 International Electron Devices Meeting Digest (IEDM 98) pp. 59-62). FIG. 17 is a cross sectional view showing a structure of a Hetero-Junction Field Effect Transistor (which will be referred to as HJFET hereinafter) included in conventional type of transistors.

In this HJFET, a buffer layer 211 is formed on a GaAs substrate 210, and a GaAs operation layer 212 is formed on the buffer layer 211. An AlGaAs Schottky layer 213 and a GaAs contact layer 214 are formed on the GaAs operation layer 212. A source electrode 201 and a drain electrode 203 are placed on the GaAs contact layer 214. These electrodes are in ohmic-contact with the GaAs contact layer 214. On the other hand, the GaAs contact layer 214 between the source electrode 201 and the drain electrode 203 is selectively removed, and a gate electrode 202 is placed on the AlGaAs Schottky layer 213 and is in Schottky-contact therewith. A surface protective film 221 is formed as the uppermost layer.

In such AlGaAs/GaAs-based FET, high density of surface states are generated on a surface of the AlGaAs Schottky layer 213. It is known that in the case where the gate electrode 202 is biased at a negative voltage, negative charges are trapped at the surface states, whereby the depletion layer is extended so that electric field concentration on the drain side of the gate electrode 202 is reduced. However, there is known the phenomenon that when density of the surface states is in excess of a predetermined level, even if the gate electrode 202 is biased at a positive voltage in the case of high frequency operation, since de-trapping of negative charges trapped at the surface states is slow, the maximum drain current in the case of RF operation with large signal level is reduced so that the saturated output level is lowered. For this reason, in general, density of the surface states in AlGaAs/GaAs-based transistor is controlled in order to prevent lowering of saturated output level for high frequency operation, concentration. Accordingly, as a breakdown voltage of the AlGaAs/GaAs-based transistor, e.g., 20 V is a limit, and thus, the operation voltage thereof is limited to a half of the breakdown voltage, e.g., 10 V.

As stated above, in FETs using compound semiconductor, since the gate electrode is in the Schottky-contact with a channel layer formed on the semiconductor substrate, an electric field concentrates on the lower end of the drain side of the gate electrode, which may cause the breakdown therein. In the case of high output FETs for which a large signal operation is required, the aforementioned phenomenon particularly leads to large problems in the case of the high power FET requiring operation with the large signal level. In view of the above, numbers of attempts to prevent electric field concentration onto the drain side edge part of the gate electrode to realize improvement in breakdown voltage characteristic have been extensively made so far. For example, in the Non-Patent Document 1: K. Asano et al., 1998 International Electron Devices Meeting Digests (IEDM 98) pp. 59-62, there is disclosed an HJFET to which a field plate electrode is added.

FIG. 19 is a cross sectional view showing the structure of such a type of HJFET. The HJFET shown in FIG. 19 is formed on a GaAs substrate 210, and a buffer layer 211 made of a semiconductor layer is formed on the GaAs substrate 210. A GaAs channel layer 212 is formed on the buffer layer 211. An AlGaAs Schottky layer 213 is formed on the GaAs channel layer 212, and a GaAs contact layer 214 is formed on the AlGaAs Schottky layer 213. A source electrode 201 and a drain electrode 203 are placed on the GaAs contact layer 214. These electrodes are in ohmic-contact with the GaAs contact layer 214. On the other hand, the GaAs contact layer 214 between the source electrode 201 and the drain electrode 203 is selectively removed, and a gate electrode 202 is placed on the AlGaAs Schottky layer 213 and is in Schottky-contact therewith. A first insulating film 215 is formed as the uppermost layer thereon to function as a surface protective film.

Further, a first field plate electrode 216 is placed between the gate electrode 202 and the drain electrode 203. The first field plate electrode 216 is electrically connected to the gate electrode 202. The surface of the AlGaAs Schottky layer 213 is covered by the first insulating film 215. This first insulating film 215 is laid immediately under the first field plate electrode 216.

FIG. 18 is a chart showing the relationship between pulse width and pulse current of a conventional type of transistors. In the case where the first field plate electrode 216 is provided (shown by "●" in the figure), it is possible to suppress reduction of a drain current (i.e. pulse current in the figure) during high frequency operation while maintaining a high breakdown voltage as compared to the case where no field plate electrode is provided (shown by "○" in the figure). Namely, reduction of the drain current (i.e. pulse current in the figure) at the time of high frequency operation can be suppressed by adding the field plate electrode, and whereby it is possible to improve gate breakdown voltage without lowering saturated output at the time of high frequency operation.

DISCLOSURE OF THE INVENTION

Problems to be Solved by the Invention

However, in the HJFET which has been previously described with reference to FIG. 19, there is a fear that feedback capacity due to parasitic capacity immediately below the field plate part may become large so that gain is lowered, as shown in FIGS. 16 and 20. FIG. 16 is a view for explaining lines of electric force between the gate and the drain of the HJFET comprising the first insulating film 215 and the field plate. Moreover, FIG. 20 is a chart showing the relationship between operating voltage and gain of the transistor. In FIG. 20, $L_{FP}$ indicates length of the field plate electrode, and for the example shown therein, $L_{FP}$ is set 0.8 μm.

Moreover, although the technical field is different, in Patent Document 1: JP 2005-93864 A, there is disclosed such a structure in which plurality of field plates are provided in a GaN-based transistor. In accordance with Patent Document 1: JP 2005-93864 A, an interposer electrode part of a second field plate electrode is interposed between a first field plate electrode and a drain electrode, which structure may substantially cancel capacity between the gate and the drain.

However, as the result of the fact that the inventors have studied the structure suggested in the Patent Document 1: JP 2005-93864 A, it has been found that there still exists a room in improving breakdown voltage characteristic while improving gain in a high frequency region.

The present invention has been made in view of the aforementioned circumstances, and provides a field effect transistor with both a satisfactory high frequency characteristic and an excellent performance under high voltage operation condition.

Means for Solving the Problems

The inventors have energetically conducted studies from a viewpoint of improving gain in a high frequency region of the field effect transistor to improve a breakdown voltage characteristic while improving high frequency characteristic. In particular, they have studied the relationship between frequency f and linear gain (hereinafter simply referred to as "gain" as occasion may demand) in connection with the transistor (FIG. 19) comprising the field plate for ensuring advantage in breakdown voltage. It is known that there exists a "turning point" where gain, in the transistor, is rapidly lowered when an operating frequency is above a certain frequency. There are many cases where a field effect transistor is used on the lower frequency side relative to the turning point in order to obtain a high gain level. Accordingly, when the turning point exists on the lower frequency side, an upper limit of a usable frequency would be lowered.

FIG. 21 is a chart for explaining a turning point existing in the high frequency region. As indicated by solid line in the figure, frequency fc is the turning point. On the high frequency side relative thereto, gain is remarkably lowered. From this fact, it is understood that it is necessary for improving the high frequency characteristic to improve the gain, and to allow the turning point to be located on the high frequency side.

Moreover, in Patent Document 1: JP2005-93864 A which has been previously described in the section of the problems to be solved, there is described a power HEMT in which a second field plate electrode is formed from the upper surface of the first field plate electrode toward the upper surface of the source electrode. In this power HEMT, the second field plate electrode and the source electrode are electrically connected in the operating region, and these electrodes are biased at the same electric potential.

In view of the above, as the result of the fact that the inventors have then studied such a type of transistor, in the case where the second field plate electrode is provided from the first field plate electrode toward the source electrode, it has been found as indicated by dotted lines in FIG. 21 that while gain in the low frequency region is improved, the turning point would shift toward the lower frequency side (i.e. fc' in the figure).

In view of the above, the inventors have further studied the cause of shift of the turning point. As a result, the inventors have newly obtained the finding that when the length of the overlap region of a structure comprising the gate electrode and the first field plate and the second field plate is larger than the gate length, the turning point shifts toward the lower frequency side.

It is to be noted that, in this specification, the overlap region is a region where the second field plate is laid above the upper part of the structure comprising the first field plate and the gate electrode, and is a region where the second field plate and the structure overlap with each other in the gate length direction in the cross sectional view in the gate length direction. As illustrated later in the examples, since when the overlap region is longer than the gate length, the turning point shifts toward the low frequency side, there is conceived a tendency such that gain in the high frequency region is remarkably lowered.

On the basis of the aforementioned findings, the inventors have studied out transistors which are excellent in the breakdown voltage characteristic, and have high gain and a turning point located on the high frequency side. As a result, it has been found out that the overlap region of the field plate electrode is set up to be of a specific structure, and a shielding part is provided in the second field plate in a field effect transistor having a dual field plate structure to thereby have ability to realize such an aimed transistor.

The present invention has been completed on the basis of such new findings.

In accordance with the present invention, there is provided a field effect transistor comprising:

a semiconductor substrate made of GaAs or InP;

a layer structure made of compound semiconductor provided on the semiconductor substrate;

a source electrode and drain electrode formed on the layer structure made of compound semiconductor with a space separating each other;

a gate electrode placed between the source electrode and drain electrode;

a first field plate placed over the layer structure made of compound semiconductor in a region between the gate electrode and the drain electrode, and isolated from the layer structure made of compound semiconductor; and a second field plate placed over the layer structure made of compound semiconductor, and isolated from the layer structure made of compound semiconductor and the first field plate, wherein the second field plate comprises a shielding part located in a region between the first field plate and the drain electrode, and serving to shield the first field plate from the drain electrode, and the upper end of the shielding part is located above an upper surface of the first field plate, whereby, in a cross sectional view in the gate length direction, when a gate length is designated as Lg; and a length in the gate length direction of an overlap region where the second field plate overlaps an upper part of a structure including the first field plate and the gate electrode is designated as Lol, the relation expressed below is satisfied:

$$0 \leq Lol/Lg \leq 1.$$

The field effect transistor of the present invention comprises the second field plate that is isolated from the upper part of the layer structure made of compound semiconductor, which is provided on the semiconductor substrate made of GaAs or InP, and also from the first field plate, wherein the second field plate comprises the shielding part. Further, the shielding part is placed in the region between the first field plate and the drain electrode so as to shield the first field plate from the drain electrode, and the upper end of the shielding part is located above the upper surface of the first field plate.

Here, since the corner part of the upper part of the first field plate is a part where lines of electric force concentrate, it is important for reducing parasitic capacity thereof to securely shield this part. In the field effect transistor of the present invention, the aforementioned structure is employed to provide the second field plate at the side part of the first field plate so as to overlay over the region from the side surface of the first field plate toward the upper part thereof via the upper end thereof. By using such a structure, the upper corner part of the first field plate can be securely shielded to suppress occurrence of parasitic capacity.

In this specification, the shielding part means a part in the second field plate used for shielding an electric field between the first field plate and the drain electrode. The shielding part may be constructed so as to substantially completely shield the electric field, or may be constructed so as to shield a portion thereof. The entirety of the second field plate may be used as the shielding part, or a portion thereof may be used as the shielding part. Moreover, in this specification, locating "above" refers to locating on the side away from the semiconductor substrate and locating "below" refers to locating on the semiconductor substrate side.

Further, in the field effect transistor of the present invention, the length in the gate length direction of the overlap region: Lol is chosen so as to satisfy the following relation:

$$0 \leq Lol/Lg \leq 1.$$

By choosing as 0=Lol, occurrence of parasitic capacity between the structure comprising the first field plate and the gate electrode and the second field plate can be more securely suppressed, and thus shift toward the lower frequency side of the turning point can be more securely suppressed. Therefore, it is possible to more securely suppress lowering of gain in the high frequency region. For this reason, it is possible to securely improve the high frequency characteristic.

Moreover, in the manufacturing process thereof, by attaining such limitation as 0<Lol/Lg≦1, electric field concentration in question can be relieved with good reproduction, and thereby operation at a high voltage is permitted, and the turning point can be retained on the high frequency side. Thus, the field effect transistor of the present invention is constructed in the structure which is operable at a high voltage and is excellent in the high frequency characteristic.

The field effect transistor of the present invention may comprise a substrate made of compound semiconductor as the semiconductor substrate, and may comprise, more specifically, a substrate made of GaAs or substrate made of InP.

In the field effect transistor of the present invention, there may be preferably employed such a structure in which the lower end of the shielding part is located on the side of the semiconductor substrate relative to the lower end of the first field plate. By choosing such a structure, it is possible to more stably shield the first field plate from the drain electrode.

In this specification, the lower end of the shielding part is, e.g., a lower surface of the shielding part. In the case where the lower surface of the shielding part comprises offset or inclination, the lower end of the shielding part refers to the end part of the semiconductor substrate side.

In this structure, there may be employed a structure in which the field effect transistor further comprises a first insulating film for covering the upper part of the semiconductor substrate in the region between the gate electrode and the drain electrode, wherein a recessed part is provided at the first insulating film in the region between the first field plate and the drain electrode, and the first field plate is provided in a manner in contact with an upper surface of the first insulating film, and the lower end of the shielding part is located within the recessed part. By choosing such a structure, the field effect transistor in which the lower end of the shielding part is located on the side of the semiconductor substrate relative to the lower end of the first field plate can be constructed in the structure which is more excellent in the manufacturing stability.

Moreover, in the field effect transistor of the present invention, there may be also employed a structure in which the lower end of the first field plate is located on the side of the semiconductor substrate relative to the lower end of the shielding part. By employing such a structure, the level of effect of the field plate on the drain side can be modulated to provide an ideal distribution of electric field. For this reason, it is possible to effectively make improvement in the breakdown voltage characteristic while reduction in the high frequency characteristic is suppressed within a minimum level.

In this structure, the field effect transistor may comprise the first insulating film for covering a surface of the layer structure made of compound semiconductor in the region between the gate electrode and the drain electrode; and a second insulating film provided on the first insulating film in the region between the first field plate and the drain electrode, wherein the first field plate is provided in a manner in contact with an upper surface of the first insulating film, and the lower end of the shielding part is in contact with an upper surface of the second insulating film. By choosing such a structure, the distance between the field plate and the semiconductor substrate is adjusted, thereby making it possible to adjust a value of electrostatic capacity. For this reason, while reduction in the high frequency characteristic is suppressed within a minimum level, a field effect transistor effectively having improving in breakdown voltage can be constructed in such a structure which can be further stably manufactured.

EFFECT OF INVENTION

As described above, in accordance with the present invention, a field effect transistor exhibiting both good performance under high voltage and high frequency operation condition can be realized.

Figure 1:
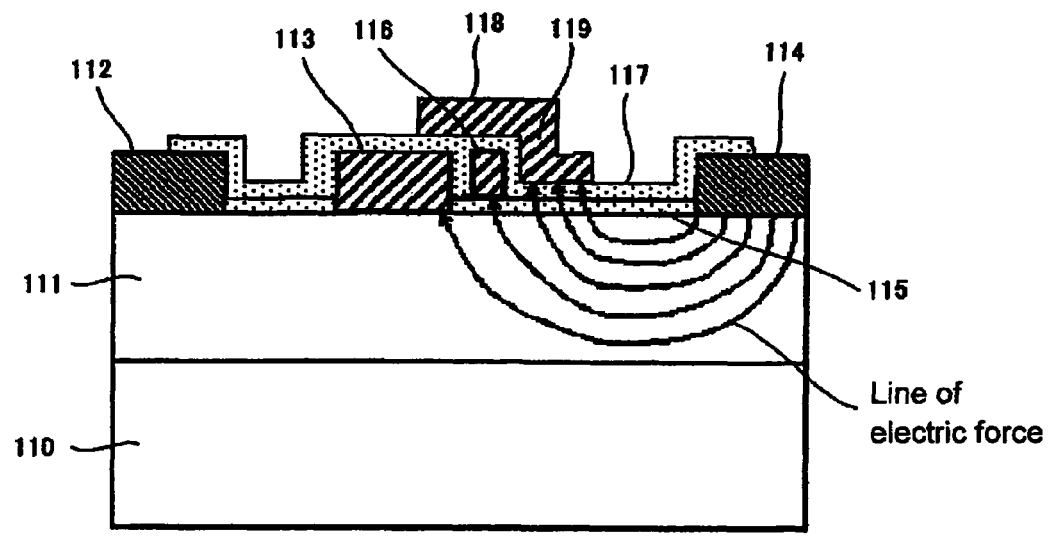
FIG. 1 is a cross sectional view schematically showing the structure of a field effect transistor according to an exemplary embodiment of the present invention, and lines of electric force reflecting an electric field distribution in the gate-drain region thereof.

In the aforementioned drawings, reference symbols described below have the following meanings.

110 Semiconductor substrate
111 Compound semiconductor
112 Source electrode
113 Gate electrode
114 Drain electrode
115 First insulating film
116 First field plate electrode
117 Second insulating film
118 Second field plate electrode
131 GaAs layer
132 AlGaAs layer
133 GaAs layer

BEST MODE FOR CARRYING OUT THE INVENTION

Exemplary embodiments of the present invention will now be explained by referring to examples of the case where FET formed on a GaAs substrate. In all the drawings, the same reference symbols are respectively attached to common structural elements, and explanations common therefor in the following disclosures will be omitted as occasion demands. While detailed explanation will be made for the exemplary embodiments and the examples which will be referred to below by taking an example of the case of a GaAs-based compound semiconductor FET, which operation is made with use of carriers generated by doping of impurities, the present invention is not limited to such a type of FET, but may be also applied to another type of FET with use of carriers originated from other effect, such as an HJFET.

In the FET according to the present invention, it is generally preferable to select a form or mode where "III-V compound semiconductor" having a crystal structure of "zinc-blend" type which can be epitaxially grown on a GaAs substrate or an InP substrate, and indicating lattice constant approximately equal to lattice constant of the substrate is utilized as an operation layer thereof.

In the exemplary embodiments illustrated below, the advantages that the present invention exhibits and preferred modes thereof are shown by referring to an FET where the operation mode is "Depletion mode", particularly an HJFET.

First Exemplary Embodiment

FIG. 1 is a cross sectional view showing the structure of a field effect transistor of the present exemplary embodiment. The field effect transistor shown in FIG. 1 comprises a dual field plate structure.

This transistor comprises a semiconductor substrate 110 made of GaN or InP, a layer structure made of compound semiconductor (compound semiconductor 111) provided on the semiconductor substrate 110, a source electrode 112 and a drain electrode 114 which are formed on the upper part of the compound semiconductor 111 in a spaced manner, a gate electrode 113 placed between the source electrode 112 and the drain electrode 114, a first field plate (first field plate electrode 116) provided above the semiconductor substrate 110 in the region between the gate electrode 113 and the drain electrode 114 and isolated from the compound semiconductor 111 (semiconductor substrate 110), and a second field plate (second field plate electrode 118) provided above the compound semiconductor 111 (semiconductor substrate 110) and isolated from the compound semiconductor 111 (semiconductor substrate 110) and the first field plate electrode 116.

The second field plate electrode 118 comprises a shielding part 119 located in the region between the first field plate electrode 116 and the drain electrode 114, and serving to shield the first field plate electrode 116 from the drain electrode 114. Moreover, the second field plate electrode 118 comprises an offset portion in the cross sectional view in the gate length direction, wherein a part of vertical type connecting one step and another step serves as the shielding part 119.

The upper end of the shielding part 119 is located above the upper surface of the first field plate electrode 116, i.e., on the side away from the semiconductor substrate 110 (compound semiconductor 111).

In the cross sectional view in the gate length direction, when the length in the gate length direction of the overlap region where the second field plate electrode 118 overlaps the upper part of a structure comprising the first field plate electrode 116 and the gate electrode 113 is designated as Lol, and a gate length is designated as Lg, the relation expressed below is satisfied:

$$0 \leq Lol/Lg \leq 1.$$

For example, Lol=0, i.e., Lol/Lg=0 may be selected.

In FIG. 1, the second field plate electrode 118 is provided in a manner in contact with a layer of an insulating film (second insulating film 117) which covers the side surface of the first field plate electrode 116. Within substantially the same horizontal surface level as that of the upper surface of the gate electrode 113, the second field plate electrode 118 overlaps with also the insulating film (second insulating film 117) provided from the side surface of the first field plate electrode 116 toward the upper surface thereof.

The field effect transistor shown in FIG. 1 comprises a first insulating film (first insulating film 115) covering over the semiconductor substrate 110 (compound semiconductor 111) in the region between the gate electrode 113 and the drain electrode 114 and a second insulating film (second insulating film 117) provided on the first insulating film 115 in the region between the first field plate electrode 116 and the drain electrode 114, wherein the first field plate electrode 116 is provided in a manner in contact with an upper surface of the first insulating film 115, and the lower end of the shielding part 119 is in contact with an upper surface of the second insulating film 117. This is the construction in which the lower end of the first field plate electrode 116 is located on the side of the semiconductor substrate 110 (compound semiconductor 111) relative to the lower end of the shielding part 119.

The compound semiconductor 111 is a layer structure made of a III-V compound semiconductor containing As.

The first field plate electrode 116 is biased at the same electric potential as that of the gate electrode 113. On the other hand, the second field plate electrode 118 is biased at the same electric potential as that of the source electrode 112. In particular, the source electrode 112 and the second field plate electrode 118 are formed in such a form that they are electrically independent from each other in the operation region. In the cross sectional view of the operation region, the source electrode 112 and the second field plate electrode 118 are shaped in separate form, but the source electrode 112 and the second field plate electrode 118 are electrically connected in an isolation region.

The first field plate electrode 116 comprises an electric field control electrode provided in a manner spaced from the gate electrode 113.

While, in the field effect transistor shown in FIG. 1, the second field plate electrode 118 and the first field plate electrode 116 overlap with each other, and the second field plate electrode 118 and the gate electrode 113 also overlap with each other, there may be employed a structure in which the second field plate electrode 118 and the first field plate electrode 116 overlap with each other, but the second field plate electrode 118 and the gate electrode 113 do not overlap with each other.

Moreover, when, in the cross sectional view in the gate length direction, the extension width in a gate length direction of the first field plate electrode 116 from the gate electrode 113 end part toward the drain electrode 114 is designated as Lfp1, the length in the gate length direction of the lower surface of the second field plate electrode 118, i.e., the length in the gate length direction of the lower surface of the second field plate 118 from the gate side end part of the shielding part 119 up to the drain side end part of the second field plate electrode 118 is designated as Lfp2, the structure may be constructed in such a shape in which the following formula (I) is satisfied.

$$0.5 \times Lfp1 \leq Lfp2 \tag{1}$$

Moreover, as illustrated in the examples, the field effect transistor of the present exemplary embodiment may be of a wide recess structure. In such a case, there may be employed a structure in which the gate electrode 113 is provided in a manner in contact with an upper surface of the compound semiconductor 111, a contact layer (GaAs layer 133 shown in FIG. 5) is interposed between the compound semiconductor 111 and the drain electrode 114 so that the contact layer has recess structure, the first insulating film 115 is provided on the compound semiconductor 111 (AlGaAs layer 132 shown in FIG. 5) exposed at the level identical to that of the bottom surface of the contact layer, the first field plate electrode 116 is provided in a manner in contact with the part of the first insulating film 115, and the second field plate electrode 118 is provided in a manner in contact with the second insulating film 117 for covering the side surface of the first field plate electrode 116, wherein, when the extension width in the gate length direction of the first field plate electrode 116 from the gate electrode 113 end part toward the drain electrode 114 is designated as Lfp1, the length in the gate length direction of the lower surface of the second field plate electrode 118 is Lfp2, the length between the gate electrode 113 and the drain side end part of the recess bottom surface of the contact layer is designated as Lgr, and the thickness of the second insulating film 117 at the side surface of the first field plate electrode 116 is designated as d3, the following formulas (1) and (2) are satisfied.

$$0.5 \times Lfp1 \leq Lfp2 \tag{1}$$

$$Lfp1 + Lfp2 + d3 \leq \tfrac{3}{5} \times Lgr \tag{2}$$

Moreover, in cross sectional view in the gate length direction, there may be also employed a structure in which when the length in the gate length direction of the lower surface of the second field plate electrode 118 is designated as Lfp2, and the distance between the lower surface of the shielding part 119 of the second field plate electrode 118 in the region between the first field plate electrode 116 and the gate electrode 113 and the compound semiconductor 111 is designated as d2, the following formula (3) is satisfied;

$$d2 \leq 0.5 \times Lfp2 \tag{3}$$

For instance, the first insulating film 115 may be made of an oxide film, in particular, a $SiO_2$ film.

The construction of the field effect transistor shown in FIG. 1 will now be described in more detail.

In this field effect transistor, the source electrode 112 and the drain electrode 114 are formed on the surface of the compound semiconductor 111 which has grown on the semiconductor substrate 110. Moreover, there are formed on the surface the gate electrode 113 and the first field plate electrode 116 through the first insulating film 115. The first field plate electrode 116 is electrically connected to the gate electrode 113 on the active region or on the isolation region of the device. Further, the device is constructed in a dual field plate structure in which the second field plate electrode 118 is provided adjacent to the first field plate electrode 116 through the second insulating film 117. The second field plate electrode 118 is electrically connected to the source electrode 112 on the isolation region of the device.

There is employed a form such that only an insulating film exists, e.g., only the first insulating film (first insulating film 115) exists between the lower surface of the first field plate electrode 116 (first field plate) and the upper surface of compound semiconductor 111 (layer structure made of compound semiconductor). In such a case, the thickness d1 of the first insulating film (first insulating film 115) is selected so that it falls within the range where an electric field formed in the first insulating film (first insulating film 115) resulting from a voltage applied to the first field plate electrode 116 (first field plate) is not above a breakdown electric field strength at which dielectric breakdown of the insulating film takes place. Also when the same voltage as, e.g., a turn-on voltage of about 1 V applied to the gate 113 is applied to the first field plate electrode 116 (first field plate), it is necessary to select such a condition that the thickness be set at least within the range of $d1 \geq 1$ nm, in the case where the first insulating film (first insulating film 115) is a $SiO_2$ film, as the condition for keeping the field in the range being not above the breakdown electric field strength. Moreover, when an electric potential of the first field plate electrode 116 (first field plate) became equal to that of gate electrode, it is necessary for attaining effective moderation in electric field to select a ratio between Lfp1 and d1 so that it at least falls within the range of $Lfp1 \geq d1$. In general, it is preferable to select the ratio between Lfp1 and d1 so that it falls within the range of $Lfp1 \geq d1 \times (\epsilon_1/\epsilon_0)$ in performing notation by making use of dielectric constant $\epsilon_1$ of an insulating film utilized for the first insulating film (first insulating film 115) and dielectric constant $\epsilon_0$ in vacuum. For example, in the case where the first insulating film (first insulating film 115) is a $SiO_2$ film, when dielectric constant of the $SiO_2$ film is expressed as $\epsilon_{SiO2}$, it is preferable to select the ratio between Lfp1 and d1 so that it falls within the range of $Lfp1 \geq d1 \times (\epsilon_{SiO2}/\epsilon_0)$.

On the other hand, there is employed a form such that the first field plate electrode 116 (first field plate) and the second field plate electrode 118 (second field plate) are formed in the state where the second insulating film (second insulating film 117) lies therebetween.

As a constituent material for the channel layer in the compound semiconductor 111 and for the semiconductor substrate 110, there may be used III-V compound semiconductors including GaAs. For instance, the III-V compound semiconductors include GaAs, AlGaAs, InP, and GaInAsP. By using a material made of the III-V compound semiconductor, a higher speed and higher output field effect transistor can be realized. More specifically, the compound semiconductor 111 is constructed in such a structure that a GaAs layer and an AlGaAs layer are layered up in order recited from the lower side (semiconductor substrate 110 side). In addition, a GaAs layer functioning as a contact layer may be further provided between the AlGaAs layer and the source and drain electrodes 112 and 114.

In such a case, as the semiconductor substrate 110, there may be utilized a substrate of high resistance. In particular, for the purpose of fabricating a FET used in the high frequency region, it is preferable to select at least resistivity of the semiconductor substrate within the range of $>10^4$ ohm·cm in such a case of forming a microwave integrated circuit being composed of FETs fabricated on the substrate. Typically, the resistivity of the semiconductor substrate is selected as high as $>10^4$ ohm·cm, thereby making it possible to suppress loss resulted therefrom in such a low level that results in no problem when the operating frequency of the microwave integrated circuit is set 100 GHz or less. In particular, in employing the III-V compound semiconductor substrate, it is more preferable to use a so-called semi-insulating substrate.

Specific combinations of the first insulating film 115 and the second insulating film 117 include a structure in which the first insulating film 115 and the second insulating film 117 are respectively a $SiO_2$ film and a SiN film, for example. By employing such a combination, it is possible to further effectively suppress occurrence of surface charges trapped on the surface of the compound semiconductor 111.

Moreover, this field effect transistor is constructed in such a structure wherein, between the length Lol in the gate length direction of the overlap region where the first field plate electrode 116 and the gate electrode 113, and the second field plate electrode 118 overlap with each other and the gate length Lg, the relations expressed below hold:

$$Lol = 0, \text{ or} \quad (i)$$

$$0 < Lol/Lg \leq 0 \quad (ii)$$

The overlap region is defined as the region where the second field plate electrode 118 and the structure comprising the first field electrode 116 and the gate electrode 113 overlap with each other in the gate length direction in the cross sectional view in the gate length direction.

The overlap region is set in such a structure that the aforementioned relation (ii) is satisfied, thereby permitting the turning point to exist on the high frequency side. For this reason, lowering of gain in the high frequency region is suppressed as to improve the high frequency characteristic, and the structure will further securely shield the first field plate electrode 116 from the drain electrode 114. Further, by choosing the ratio between Lol and Lg within the aforementioned range, the magnitude of excess parasitic capacity between the gate and the source can be sufficiently reduced with respect to the actual gate capacity resulting from the gate length Lg of the gate electrode 113.

It is to be noted that in the case where the structure which satisfies the relation (ii) is chosen, more preferably, such a structure which satisfies the following relation $0 < Lol/Lg \leq 0.7$ is chosen. By employing the structure based on such a relation, it is possible to more suitably suppress parasitic capacity between the gate and the source. In addition, it is possible to more stably suppress the shift of the turning point toward the low frequency side.

Moreover, there may be employed the structure in which the length Lol of the overlap region satisfies the relation (i), thereby making it possible to further suitably suppress parasitic capacity between the gate and the source. Further, it is possible to further suitably suppress lowering of gain.

In this case, as the result of the fact that second insulating film (second insulating film 117) is interposed also between the first field plate electrode 116 (first field plate) side wall and the shielding part 119 of the second field plate electrode 118 (second field plate), additional parasitic capacity is produced. This additional parasitic capacity resulting from the shielding part 119 also contributes to parasitic capacity between the gate and the source. For the purpose of suppressing contribution of the additional parasitic capacity resulting from the shielding part 119, choice is made such that the height hfp1 of the first field plate electrode 116 (first field plate) side wall is set within the range being at least no higher than the height hg of the gate electrode 113. Namely, it is preferably that, in the structure shown in FIG. 2, the height hfp1 of the side wall of the first field plate electrode 116 (first field plate) is generally selected so that it falls within the range of $hfp1 \leq 0.4$ μm.

The shielding part 119 is defined as a region provided between the first field plate electrode 116 and the drain electrode 114 of the second field plate electrode 118, and extends in a normal direction of the semiconductor substrate 110. The shielding part 119 is provided along the side surface of the first field plate electrode 116, and serves to shield the first field plate electrode 116 from the drain electrode 114. Further, since the upper surface (upper end) of the shielding part 119 is located above the upper end (upper surface) of the first field plate electrode 116, it is possible to shield, by the shielding part 119, the upper corner part and upper and lower regions thereof of the first field plate electrode 116, in which corner region lines of electric force are apt to concentrate. For this reason, it is possible to suitably suppress occurrence of feedback capacity between the first field plate electrode 116 and the drain electrode 114.

On the other hand, the lower end of the first field plate electrode 116 is located on the compound semiconductor 111 side relative to the lower end of the shielding part 119. This is the structure in which the thickness of the insulating film lying immediately under respective field plates becomes thicker according as the distance from the gate electrode 113 side increases. More specifically, the first field plate electrode 116 which is biased at the same electric potential as that of the gate electrode 113, and the second field plate electrode 118 which is biased at the same electric potential as that of the source electrode 112 are respectively formed in order on the first and second insulating films 115 and 117 in the region between the gate electrode 113 and the drain electrode 114. By employing such a structure, the degree of effect of the field plate on the drain side can be moderated as to provide an ideal electric field distribution. For this reason, it is possible to more effectively improve a breakdown voltage.

Further, the first field plate electrode 116 is biased at the same electric potential as that of the gate electrode 113. On the other hand, the second field plate electrode 118 may be set to be biased at a predetermined electric potential, for instance at the same electric potential as that of the source electrode 112. By choosing such a condition, it is possible to more reliably reduce capacity between the first field plate electrode 116 and the drain electrode 114. Further, a voltage applied to the second field plate electrode 118 may be dynamically changed.

Moreover, the second field plate electrode 118 is biased at the same electric potential as that of the source electrode 112 to shield the first field plate electrode 116 from the drain electrode 114, and thereby large part of lines of electric force between the first field plate electrode 116 and the drain electrode 114 are terminated. For this reason, the feedback capacity between the first field plate electrode 116 and the drain electrode 114 can be greatly reduced to improve the gain of the high frequency region of the transistor.

Figure 19:
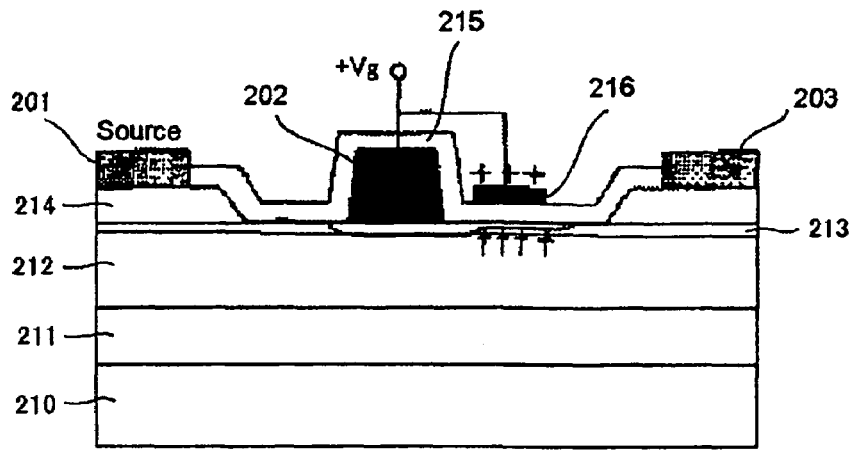
FIG. 19 is a cross sectional view schematically showing the structure of a conventional type of field effect transistor comprising one field plate electrode which is biased at the same electric potential as that of the gate electrode, and the function of the field plate electrode.
Figure 20:
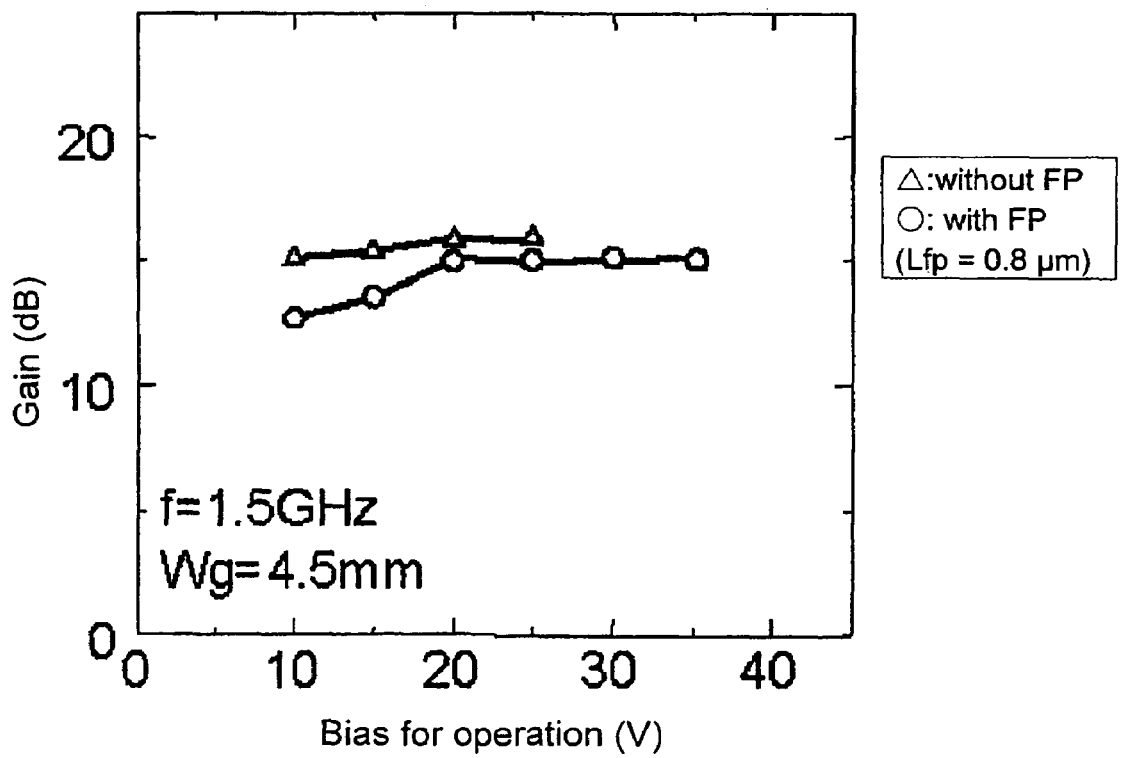
FIG. 20 is a chart showing the relationship between operating voltage and gain in two conventional types of field effect transistors which respectively comprise one field plate electrode which is biased at the same electric potential as that of a gate electrode, and does not comprises such a field plate electrode.
Figure 21:
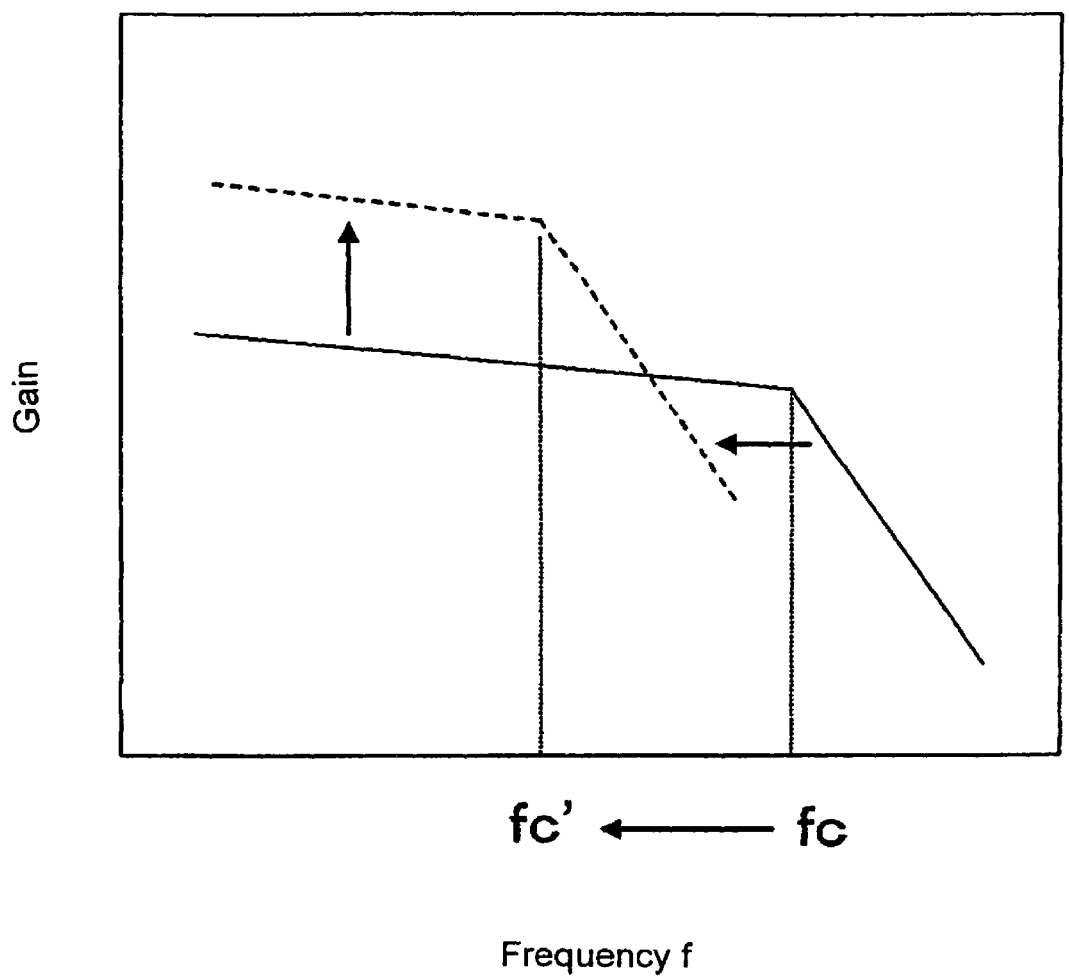
FIG. 21 is a chart schematically showing change of the relationship between frequency and gain of a conventional type of field effect transistor that is obtained by employing a field plate electrode being biased at the same electric potential as that of the gate electrode.

Further, in the field effect transistor shown in FIG. 1, in the region between the gate electrode 113 and the drain electrode 114, the first field plate electrode 116 which is biased at the same electric potential as that of the gate electrode 113, and the second field plate electrode 118 which is biased at the same electric potential as that of the source electrode 112 are respectively formed in order on the first and second insulating films 115 and 117. Accordingly, as the result of the fact that the first field plate electrode 116 which is biased at the same electric potential as that of the gate electrode 113 and the second field plate electrode 118 which is biased at the same electric potential as that of the source electrode 112 are placed in order in the drain electrode 114 direction with the second insulating film 117 having dielectric constant higher than that of air that lies therebetween, electric field concentration in the vicinity of the gate electrode 113 is greatly moderated as compared to the case of the conventional structure (FIG. 19) comprising only the first field plate electrode 116. Thus, the transistor can be operated at a higher drain voltage.

Further, since the second field plate electrode 118 is formed on the insulating film in place of the surface of the compound semiconductor 111, injection of electrons therefrom is suppressed to a lower level. For this reason, it is possible to suitably suppress lowering of saturated output at the time of high frequency operation which is caused by the negative surface charges resulting from injection of negative charges, which frequently becomes problem in the compound semiconductor transistor.

As explained above, in the field effect transistor of the present exemplary embodiment, feedback capacity between the drain electrode 114 and the gate electrode 113 is greatly reduced, and electric field concentration in the vicinity of the gate electrode 113 is also greatly moderated. For this reason, the field effect transistor shown in FIG. 1 can achieve high gain and high voltage operation, and thus is of the structure in which the output performance at the time of high frequency operation is extremely improved. For example, the field effect transistor shown FIG. 1 is adapted to reduce feedback capacity between the gate electrode and the drain electrode thus to have a high gain, and to also improve trade-off between gate breakdown voltage and lowering of saturated output. For this reason, there is provided a structure in which high output operation is possible also at a high voltage of 35 V or more.

Moreover, since the gate electrode 113 and the first field plate electrode 116 are independent members, it is possible to respectively independently select the materials for them. For example, it becomes possible to independently select a metallic material with satisfactory Schottky characteristic for the gate electrode 113, and a metallic material with low wiring resistance and good adhesion with respect to insulating film (first insulating film 115) for the first field plate electrode 116, respectively. For this reason, with the view of achieving high gain and high voltage operation, the structure of the first exemplary embodiment may have such an advantage that further excellent high frequency/high output performance can be attained as compared to a second exemplary embodiment which will be disclosed later.

Figure 2:
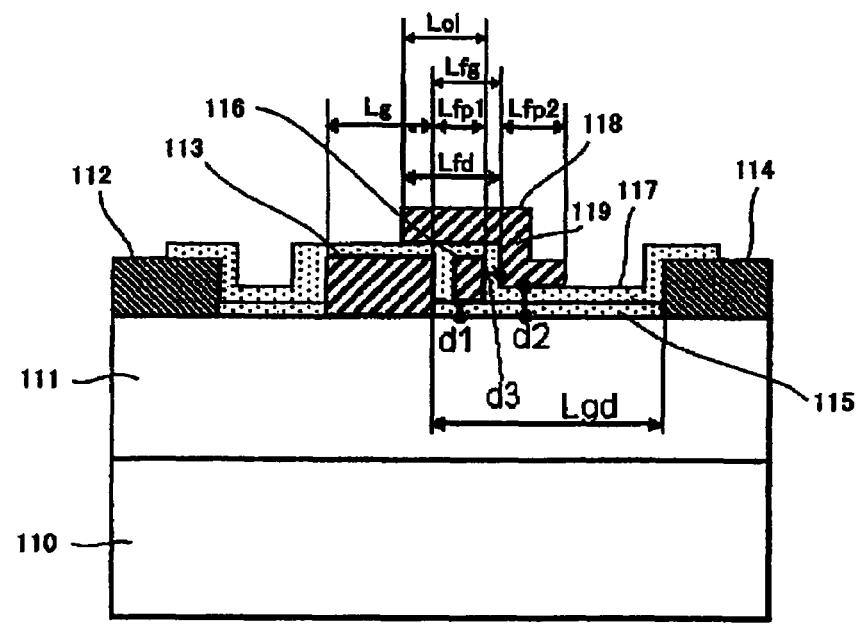
FIG. 2 is a cross sectional view showing the structure of the field effect transistor according to the exemplary embodiment of the present invention, and definition of sizes of respective structural elements thereof.

The dimensions of the second field plate electrode 118 can be determined with the view of moderating electric field concentration and reducing feedback capacity. It is more preferable that such dimensions are determined in a manner as described below, for instance in the device shown in FIG. 2. In FIG. 2 and the following description, meanings of respective marks indicating the length in the cross sectional view in the gate length direction are as follows.

Lg: Gate length,

Lfp1: Length from the drain side end part of the gate electrode 113 up to the drain electrode 114 side end part of the first field plate electrode 116, Lfp2: Length in the gate length direction of the lower surface of the second field plate electrode 118, i.e., length in the gate length direction of the second field plate 118 lower surface from the gate side end part of the shielding part 119 up to the drain side end part of the second field plate electrode 118, Lfd: Cross-section length between the structure comprising the first field plate electrode 116 and the gate electrode 113 and the second insulating film 117, and the second field plate electrode 118 through the second insulating film 117, i.e., Lfd=Lol+d3, Lgd: Distance between the gate electrode 113 and the drain electrode 114, Lgr: Distance between the drain side end part of the gate electrode 113 and the drain side end part of the recess bottom surface of the contact layer in the case of a transistor comprising a recess structure, d1: Distance between the bottom surface of the first field plate electrode 116 and the compound semiconductor 111, which corresponds to the thickness of the first insulating film 115 in the structure shown in FIG. 2, d2: Distance between the bottom surface of the second field plate electrode 118 and the compound semiconductor 111, which corresponds to the sum of the thickness of the first insulating film 115 and the thickness of the second insulating film 117 in the structure shown in FIG. 2, d3: Thickness of the insulating film lying between the first field plate electrode 116 and the second field plate electrode 118, which is equivalent to the thickness in the gate length direction of the second insulating film 117 in the structure shown in FIG. 2, and Lol: Length in the gate length direction of the overlap region of the structure comprising the gate electrode 113 and the first field plate electrode 116 and the second field plate electrode 118.

The protruded size Lfp1 toward the drain side of the first field plate electrode 116 can be set to, e.g., 0.5 μm. Thus, it is possible to more effectively suppress electric field concentration on the drain side end part of the gate electrode 113. Alternatively, Lfp1 may be 1.5 μm or less. By choosing such a structure, it is possible to more reliably suppress lowering of the high frequency characteristic following the increase in the feedback capacity.

Moreover, in regard to the second field plate electrode 118, the length Lfp2 in the gate length direction thereof may be set to, e.g., $$0.5 \times Lfp1 \leq Lfp2 \quad (1)$$

By employing such a choice, it is possible to further sufficiently shield lines of electric force between the first field plate electrode 116 and the drain electrode 114.

On the other hand, with the view of improving the breakdown voltage, it is preferable that a contact layer ((not shown) in FIG. 2) is formed between the drain electrode 114 and the compound semiconductor 111, and the end part of the second field plate electrode 118 is spaced by a predetermined distance from the drain electrode 114. In this point, in the case where, e.g., a so-called wide recess structure is employed, there may be employed a structure in which when the thickness of the insulating film lying between the first field plate electrode 116 and the second field plate electrode 118 is designated as d3, and the distance between the gate electrode 113 and the drain side end part of the recess bottom surface of the contact layer is designated as Lgr (FIG. 5), for example, the formula expressed below is satisfied:

$$Lfp1 + Lfp2 + d3 \leq \tfrac{3}{5} \times Lgr. \quad (2)$$

By employing such a structure, it is possible to still further improve the breakdown voltage. Furthermore, it is further preferable that there is employed the structure which satisfies the aforementioned formulas (1) and (2) at the same time.

In employing the wide recess structure, it is necessary, with the view of making improvement in breakdown voltage, that the distance Lgr between the gate electrode 113 and the drain side end part of the recess bottom surface of the contact layer is selected within the range which at least satisfies $Lgr \geq Lg$.

In such a wide recess structure, in order to prevent lowering of the power performance due to the influence of surface level formed on the surface of the compound semiconductor 111 (layer structure made of compound semiconductor) covered by the first insulating film (first insulating film 115), it is preferable that the Lgr is selected within the range of $Lgr \leq 3$ μm.

The insulating film lying between the first field plate electrode 116 (first field plate) and the second field plate electrode 118 (second field plate), i.e., the second insulating film (second insulating film 117) isolates them. When the first field plate electrode 116 (first field plate) is biased at the same electric potential as that of the gate electrode 113, and the second field plate electrode 118 (second field plate) is biased at the same electric potential as that of the source electrode 112, it is necessary to select the thickness d3 of the insulating film so that dielectric breakdown of the second insulating film (second insulating film 117) does not take place at such parts. For example, when the dielectric breakdown strength of the second insulating film (second insulating film 117) is designated as Ebreak2 in the case of a turn-ON voltage of the gate being 1 V, at least Ebreak2>(1 V/d3), i.e., d3>(1 V/Ebreak2) is to be satisfied.

On the other hand, with the view of reducing parasitic capacity resulting from a capacitor composed of the first field plate electrode 116 (first field plate), the second field plate electrode 118 (second field plate), and an insulating film lying therebetween, it is preferable that the thickness d3 of the insulating film used for the second insulating film (second insulating film 117) and the dielectric constant $\in 2$ of the insulating film are selected so that they fall within the range of $0.5 \text{ μm} \geq d3/(\in 2/\in_0) \geq 0.01$ μm.

Moreover, when the thickness of the first insulating film 115 is designated as d1, the distance d2 between the compound semiconductor 111 and the second field plate electrode 118 formed on the insulating film in the region between the first field plate electrode 116 and the drain electrode 114 may be set as to satisfy, for instance, the formula expressed below:

$$d2 \leq 0.5 \times Lfp2 \quad (3)$$

The aforementioned structure can be obtained by adjusting, e.g., the thickness of the first insulating film 115 and the thickness of the second insulating film 117 so that they satisfy the aforementioned formula (3). When such an approach is employed, it is possible to still further sufficiently shield lines of electric force between the first field plate electrode 116 and the drain electrode 114.

In this case, when the distance d2 between the second field plate electrode 118 and the compound semiconductor 111 is set to be, for instance, the sum of the thickness d1 of the first insulating film 115 and the thickness d3 of the second insulating film 117, its lower limit is determined by the lower limit of (d1+d3). On the other hand, in such a structure where the second field plate electrode 118 is formed after the step of recess processing as described later, the thickness d2 of the insulating film is selected in the range such that an electric field formed in the insulating film resulting from a voltage applied to the second field plate electrode 118 (second field plate) is not above a breakdown electric field strength where dielectric breakdown of this insulating film takes place. For example, when the second field plate electrode 118 (second field plate) is biased at the same electric potential as that of the source electrode, in the case where the insulating film is a $SiO_2$ film, it is necessary to select at least such a condition that the thickness d2 is set within the range of $d2 \geq 1$ nm, as the condition in which the filed is to be not above the breakdown electric field strength.

Moreover, in the present exemplary embodiment, there is employed the structure in which the relation expressed as 0≦Lfd holds, and the first and second field plate electrodes 116 and 118 are respectively provided in a manner in contact with both sides of the second insulating film 117. By employing the structure in which the first and second field plate electrodes 116 and 118 are separated by the insulating film of a single layer, it is possible to further reliably shield the first field plate electrode 116 from the drain electrode 114.

On the other hand, in the case where the first field plate electrode 116 and the second field plate electrode 118 are provided at the same horizontal level, i.e. on the surface of the first insulating film 115, and then an insulating film is provided on the entire upper surface thereof to isolate these field plates, there is a fear that air gap may be formed within the insulating film by unsatisfactory burying between electrodes. As a result, there is a fear that shielding effect of the first field plate electrode 116 with respect to the gate electrode 113 may be lowered by lowering of dielectric constant at the air gap. In view of the above, in the present exemplary embodiment, after formation of the first field plate electrode 116, the second insulating film 117 is provided from the side surface of the first field plate electrode 116 toward the upper surface of the first insulating film 115, and then the second field plate electrode 118 is formed on the second insulating film 117 so that it is suppressed that an air gap is formed at the second insulating film 117. Thus, the second field plate electrode 118 can be stably formed in the state directly in contact with the second insulating film 117. In the following exemplary embodiments, explanation will be made mainly as to points different from the first exemplary embodiment.

Second Exemplary Embodiment

While explanation has been made in the first exemplary embodiment by taking an example of the case where there is employed the structure in which the gate electrode 113 and the first field plate electrode 116 are structurally separated, and are electrically connected in the isolation region of the device, there may be employed an integral structure in which the gate electrode 113 and the first field plate electrode 116 are integrally formed in a continuous shape.

Figure 3:
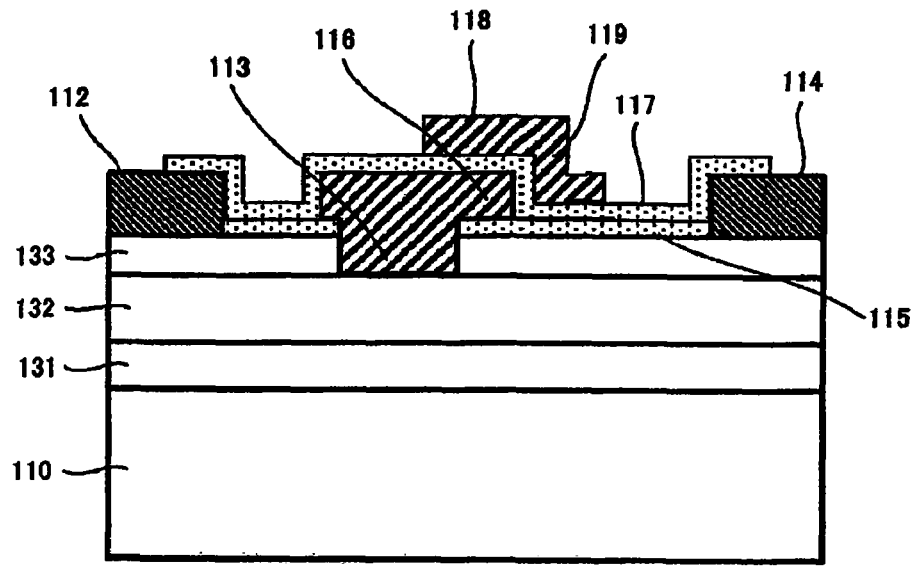
FIG. 3 is a cross sectional view showing the structure of a field effect transistor of an example.

FIG. 3 is a cross sectional view showing the structure of a field effect transistor of the present exemplary embodiment.

The fundamental structure of the field effect transistor shown in FIG. 3 is very similar to that of the field effect transistor (FIG. 1) disclosed in the first exemplary embodiment, but the first field plate electrode 116 is constructed in a manner that it is integrally continuous to the gate electrode 113. It is to be noted that "integrally continuous" refers herein to the state formed integrally as a continuous body. Moreover, it is preferable to employ a structure comprising a single member and having no connection part. By forming the gate electrode 113 and the first field plate electrode 116 in an integral shape, there can be provided a structure in which these electrodes can be simultaneously formed in the same process, and can be stably manufactured. Further, the first field plate electrode 116 can be more securely biased at the same electric potential as that of the gate electrode 113. Further, since the gate electrode 113 and the first field plate electrode 116 are integrally continuous, it becomes possible to further securely shield the drain electrode 114 side from the side surface of the gate electrode 113.

In the structure shown in FIG. 3, a layered structure comprising a GaAs layer 131, an AlGaAs layer 132, and a GaAs layer 133 is provided as the compound semiconductor 111. The GaAs layer 131, the AlGaAs layer 132 and the GaAs layer 133 respectively function as an operation layer, a Schottky layer and a contact layer. Moreover, as the GaAs layer 133 is provided between the AlGaAs layer 132 and the source electrode 112 and the drain electrode 114, the device has a so-called gate recess structure in which a portion of the lower part of the gate electrode 113 is buried in an opening part of the GaAs layer 133. With use of such a structure, further excellent gate breakdown voltage can be provided together with the action of the first field plate electrode 116.

Third Exemplary Embodiment

In the aforementioned exemplary embodiments, explanations have been made for the cases of the structure in which the lower surface of the first field plate electrode 116 is located on the side of the compound semiconductor 111 relative to the lower surface of the shielding part 119. In the field effect transistors illustrated in the aforementioned exemplary embodiments, there may be also employed a structure in which the lower surface of the shielding part 119 is located at the lower part relative to the lower surface of the first field plate electrode 116, i.e., on the compound semiconductor 111 side. In the present exemplary embodiment, explanation will be made by taking an example of the case of the transistor similar to that disclosed in the second exemplary embodiment.

Figure 11:
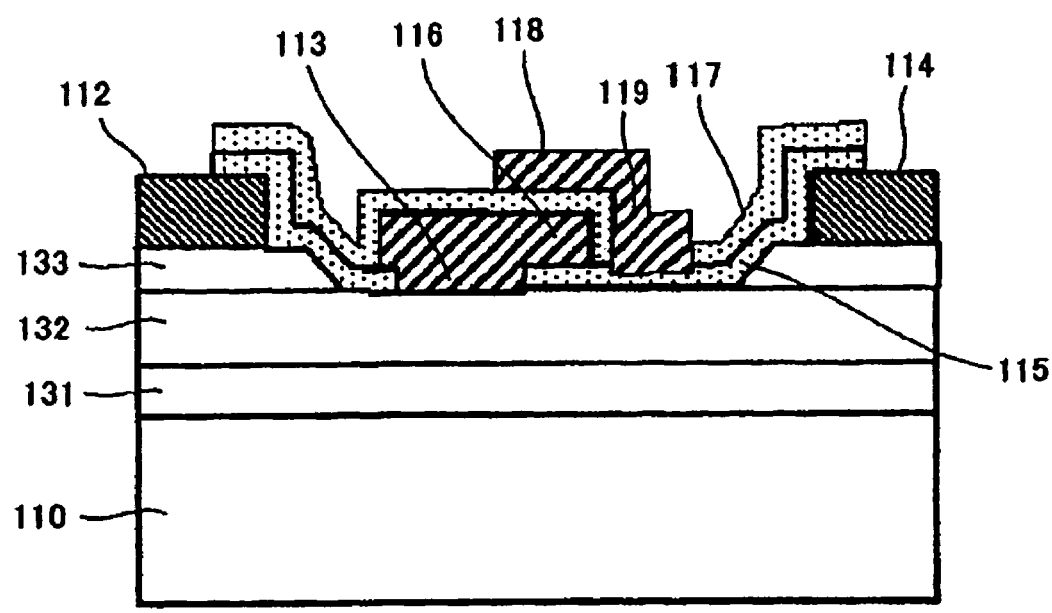
FIG. 11 is a cross sectional view showing the structure of a field effect transistor according to another exemplary embodiment of the present invention.

FIG. 11 is a cross sectional view showing the structure of the field effect transistor of the present exemplary embodiment.

In the field effect transistor shown in FIG. 11, the lower end of the shielding part 119 is located on the side of the AlGaAs layer 132 relative to the lower end of the first field plate electrode 116. Specifically, the devise comprises the first insulating film 115 for covering the AlGaAs layer 132 surface in the region between the gate electrode 113 and the drain electrode 114, wherein a recessed part (not shown) is provided at the first insulating film 115 in the region between the first field plate electrode 116 and the drain electrode 114, and the first field plate electrode 116 is provided in a manner in contact with an upper surface of the first insulating film 115. Further, the lower end of the shielding part 119 of the second field plate electrode 118 is placed within the recessed part, and the lower surface of the second field plate electrode 118 and a part therearound are buried within the recessed part. In other word, in the region where the shielding part 119 is formed, the second insulating film 117 is removed, and the first insulating film 115 is etched off to be thin. Further, the shielding part 119 is in contact with the thinned part.

By making such a modification, there is provided the structure in which the upper part (upper end) of the shielding part 119 is projected over the upper surface of the first field plate electrode 116, and the lower surface (lower end) of the shielding part 119 is projected toward the AlGaAs layer 132 side relative to the lower surface of the first field plate electrode 116. For this reason, in addition to shielding of the side surface of the first field plate electrode 116, it is possible to further effectively shield, from the drain electrode 114, the lower corner part as well as the upper corner part of the first field plate electrode 116 in which lines of electric force are apt to concentrate. Thus, feedback capacity between the first field plate electrode 116 and the drain electrode 114 is further reduced so to improve high frequency characteristic.

While there will be shown specific cases of the structures where electrons are used as carriers for operation of the FET in the following Examples, it is a matter of course that shielding effect by the second field plate can be obtained entirely in the same manner also in the structure using holes as carriers.

EXAMPLES

The structures of the aforementioned exemplary embodiments will be explained in more detail by using specific examples. The Examples 1 to 5 correspond to the second or third exemplary embodiment, and the Examples 6 to 10 correspond to the first or second exemplary embodiment.

Example 1

In the present example, the field effect transistor shown in FIG. 3 was fabricated so to evaluate its performance. As the semiconductor substrate 110, a high resistance GaAs (semi-insulating GaAs) substrate was used. As layers corresponding to the compound semiconductor 111, there were formed, e.g., an AlGaAs buffer layer (not shown) of 100 nm, a GaAs layer 131 of 400 nm, an AlGaAs layer 132 (Al composition ratio 0.20, thickness 30 nm), and a GaAs layer 133 (Si donor concentration $1 \times 10^{17}$ cm$^{-3}$, thickness 50 nm). AuGe, Ni and Au were deposited in order recited as a metallic film, and then lift-off process was used to form the source electrode 112 and the drain electrode 114, followed by heat treatment at 420° C. under nitrogen atmosphere to thereby form ohmic-contact.

Next, a SiO$_2$ film with the thickness of 100 nm was formed as the first insulating film 115, for instance, by means of thermal CVD method, and then a region where the gate electrode 113 was to be formed was opened by dry-etching. Further, the exposed part of the GaAs layer 133 was selectively removed with use of the SiO$_2$ film for the first insulating film 115 as a mask. The removal of GaAs was performed by dry etching using a gas containing chlorine and fluorine.

Subsequently, Ti and Al were deposited in order recited on the entire upper surface of the semiconductor substrate 110, and then an integral type electrode of the gate electrode 113 and the first field plate electrode 116 was formed by using the lift-off process. The gate length Lg of the gate electrode 113 was set to 1.0 μm, and Lfp1 of the first field plate electrode 116 was set to 0.8 μm.

Further, SiN with the film thickness of 150 nm was deposited as the second insulating film 117, and Ti, Pt and Au films were deposited in order recited as the upper layer thereof, and then lift-off process was carried out to form the second field plate electrode 118. The Lfd and Lfp2 of the second field plate electrode 118 were respectively set to 0.4 μm and 1.0 μm. In the subsequent wiring step, the second field plate electrode 118 was electrically connected to the source electrode 112 in the isolation region.

In addition, for the purpose of comparing the effect of the present example to conventional types of structures, a field effect transistor (shown in FIG. 19) comprising no second field plate electrode 118 was fabricated as a field plate transistor of a conventional structure.

Figure 4:
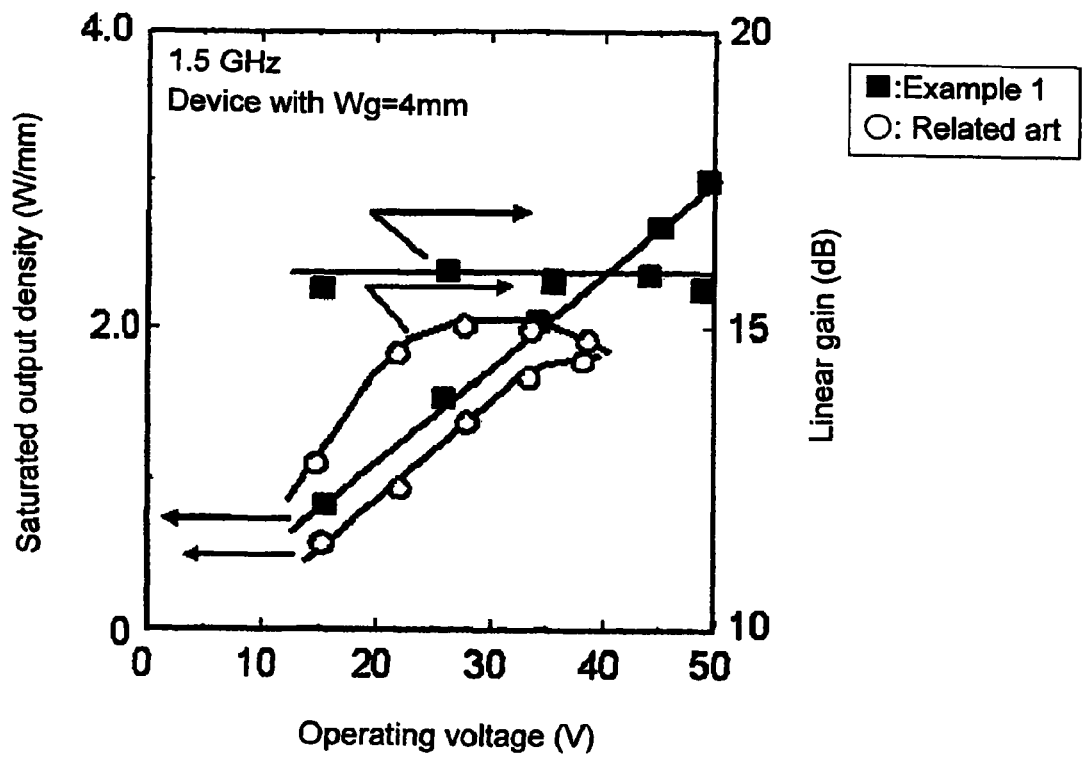
FIG. 4 is a chart showing the evaluated relationship between operating voltage and power performance (saturated output density and linear gain) for the field effect transistor of Example 1.

FIG. 4 is a chart showing results of power performance evaluated for the present example and for the conventional type of transistor at the operating frequency of 1.5 GHz. In the present example, the influence of heat generated in the transistor was suppressed to perform comparison in a continuous operation of an elemental device with a gate width of 4 mm in order to clarify the effect of the present example.

As shown in FIG. 4, in the conventional type of transistor (shown in FIG. 19), a sufficient gain cannot be provided because of feedback capacity between the gate electrode and the drain electrode resulting from the field plate part 216 at a relatively lower operating voltage, and gain was about 15 dB also at an operating voltage of 15 V or more. Moreover, also with respect to output density, there was observed such a phenomenon in which a drain current at the time of RF operation was lowered due to the surface states at an operating voltage of 35 V or more. Therefore, there was a tendency such that a saturated output was saturated at a value of 2.0 W/mm.

On the contrary, in the transistor of the present example, since feedback capacity between the gate electrode and the drain electrode was reduced, a high gain of about 16 dB was obtained from a low operating voltage. Further, since the first field plate electrode 116 and the second field plate electrode 118 are adjacent with use of second insulating film 117 as a spacer, its moderation effect of electric field concentration was high. As a result, a drain current decrease due to the surface states in the RF operation mode did not appear in operation up to 50 V, and a saturated output density was increased along with an operating voltage. Thus, a saturated output density of 3.0 W/mm was realized.

Further, explanation has been made in the aforementioned example for the transistor in which gate electrode 113 was formed in a form buried into the GaAs layer 133, and fabrication and evaluation of a transistor of the structure described below were also performed.

Figure 5:
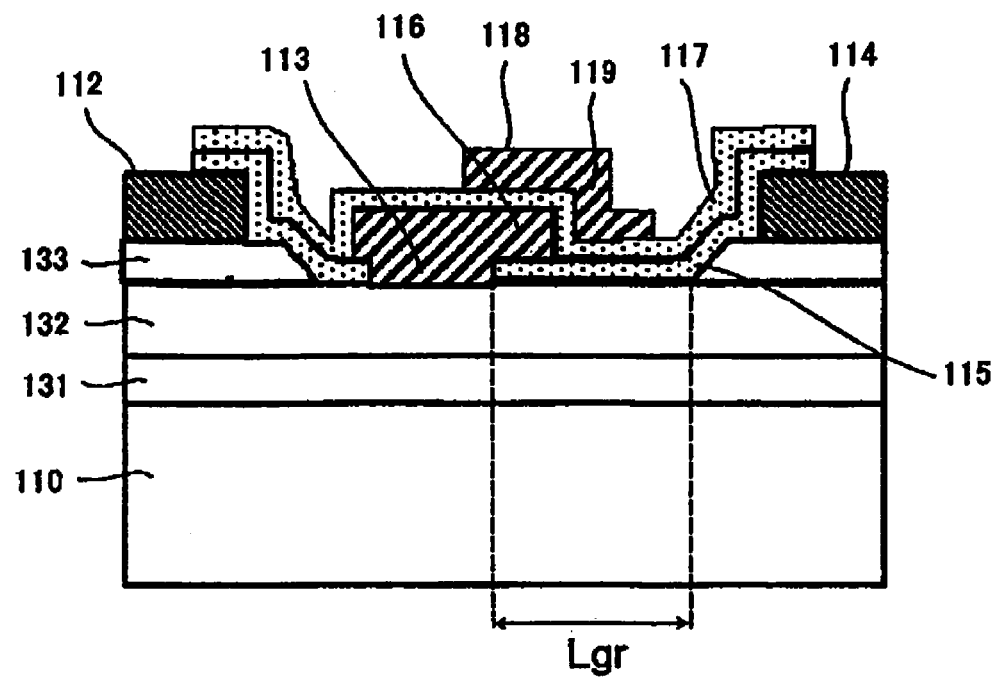
FIG. 5 is a cross sectional view showing the structure of a field effect transistor employing wide recess structure according to Example.

FIG. 5 is a view showing another structure of the present example.

While the fundamental structure of the field effect transistor shown in FIG. 5 is the structure in which the contact layer is interposed between the source electrode 112 and the surface of the AlGaAs layer 132, and between the drain electrode 114 and the surface of the AlGaAs layer 132 in similar to the transistor shown in FIG. 3, there is employed a so-called wide recess structure in the device shown in FIG. 5. In the field effect transistor shown in FIG. 5, an opening part is provided at the GaAs layer 133, and the width of the opening part becomes larger according as the distance from the semiconductor substrate 110 toward the upper part thereof is increased. There is provided the structure in which the gate length of the gate electrode 113 is shorter than the opening width of the opening part at the bottom surface of the GaAs layer 133, the AlGaAs layer 132 is exposed from the opening part at the GaAs layer 133 bottom surface, and the first insulating film 115 is provided between the exposed surface of the AlGaAs layer 132 and the first field plate electrode 116. In the case where such a structure is employed, it is possible to more effectively moderate electric field concentration of the drain side end part of the gate electrode 113 by combinational effect of the first field plate electrode 116 and the insulating film structure lying immediately therebelow.

In the present example, the transistor shown in FIG. 5 was formed in accordance with a procedure described below. After the source electrode 112 and the drain electrode 114 were formed with a space of 5 μm, a resist was provided in a predetermined region. By using this resist as a mask, the GaAs layer 133 with a width of 2.5 μm from the center between the source electrode 112 and the drain electrode 114 was selectively removed. The removal of GaAs was performed by dry etching using a gas containing chlorine and fluorine.

Further, a SiO$_2$ film with the film thickness of 100 nm was formed as the first insulating film 115, for instance, by means of thermal CVD method, and then a region of the SiO$_2$ film where the gate electrode was to be formed was opened by dry etching. Ti and Al were deposited in order recited, and then lift-off process was performed to form an integral type electrode of the gate electrode 113 and the first field plate electrode 116. The gate length Lg of the gate electrode 113 was set to 1.0 μm, and the Lfp1 of the first field plate electrode 116 was set to 0.8 μm.

When the transistor obtained was subjected to the above-described evaluation, a transistor performance with higher gain was measured.

Next, the relationship between frequency and gain was examined for the transistors used in the evaluation of FIG. 4. In particular, for the transistors shown in FIGS. 3 and 19, in which setting was made such that power supply voltage Vdd=28 V, gate width Wg=2 mm, gate length Lg=1.0 μm, Lfp1=0.8 μm, and d3=150 nm, and with variety of Lfd=0 μm, 0.4 μm, 1.0 μm, 1.4 μm, 2.0 μm and 3.0 μm, turning points where gain was abruptly lowered were measured.

Figure 22:
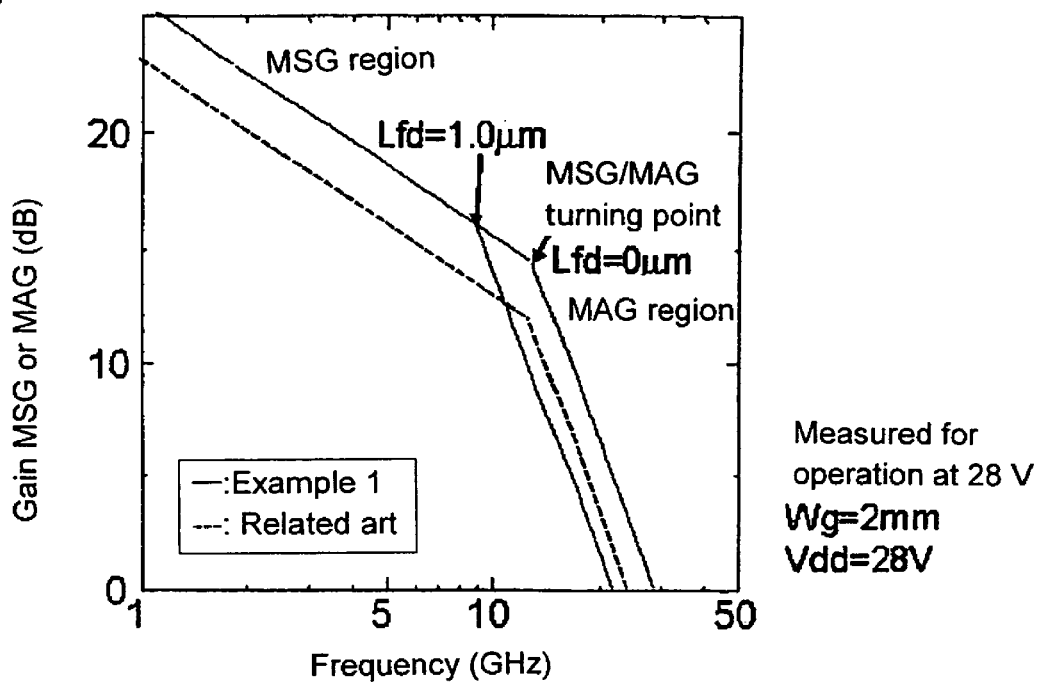
FIG. 22 is a chart showing the relationship between frequency and gain in the field effect transistor having the structure shown in FIG. 3, as explained in Example 1.

FIGS. 22(a) and 22(b) are charts showing measured results of the turning points therefor. FIG. 22(a) is a chart showing the relationship between frequency (GHz) and maximum stable power gain MSG (dB) or maximum available power gain MAG (dB). FIG. 22(b) is a chart showing the relationship between Lfd=d3+Lol (μm) and turning points (GHz) in the transistor shown in FIG. 3.

From FIGS. 22(a) and 22(b), it was possible to improve gain by using the structure shown in FIG. 3 in comparison with the conventional type of transistor (shown in FIG. 19) comprising one field plate. Specifically, when the relation expressed as $0 \leq Lfd \leq 1.0$ μm is set in the structure having gate length Lg=1.0 μm, the turning point was found to be maintained at 100 GHz or more. It was understood that operation can be performed on the low frequency side relative to the turning point, and thus a high gain can be stably obtained, for instance, in such a high frequency region of 5 GHz or more.

Moreover, it has been found out that by choosing a structure in which such setting of $0 \leq Lfd \leq 1.0$ μm, Lg=1.0 μm and d3=150 nm is made, the length Lol in the gate length direction of the overlap region of the first field plate electrode 116 and the gate electrode 113 and the second field plate electrode 118 is given by the following equation;

$$Lol/Lg=(Lfd-d3)/Lg,$$

and thus, the following relation is satisfied;

$$0 \leq Lol/Lg \leq 1,$$

it is possible to suitably maintain the turning point on the high frequency side.

It is to be noted that while Ti, Pt and Au were used as a metal serving as a material of the second field plate electrode 118 in the present example, any conductive material which does not peel on the insulating film may be used as the material of the second field plate electrode 118 in the present example and other examples disclosed below, and other metallic materials may be used, for example. Such other conductive materials include one metal, or two metals or more selected from the group consisting of, e.g., TiN, WSi, WN, Mo, Al and Cu. Selected metal or metals may be of single layer, or plural metals combined may be used as a multilayer film structure.

In addition, while the examples of the compound semiconductor transistor used in 1.5 GHz band have been described above, other frequency band may be employed in the present example and the examples described below. For example, if manufacturing is performed so that respective sizes satisfy the previously described relations in such cases where gate length Lg=0.5 μm is chosen as a center of range thereof for a transistor used in the C-band, and gate length Lg=0.10-0.25 μm is chosen as center of range thereof for a transistor used in the sub-millimeter-wave band, similar effects can be provided.

In the following examples, explanation will be made mainly as to points different from the first example.

Example 2

In the present example, the influence on the shielding effect of the Lfd: cross-section length between the structure composed of the first field plate electrode 116 and the gate electrode 113 and the second insulating film 117, and the second field plate electrode 118 through the second insulating film 117 was examined.

A device cross sectional view is shown in FIG. 5. As the semiconductor substrate 110, there was used a high resistance GaAs (semi-insulating GaAs) substrate. As layers corresponding to the compound semiconductor 111, there were formed the GaAs layer 131 (thickness 400 nm), the AlGaAs layer 132 (Al composition 0.20, thickness 30 nm), and the GaAs layer 133 (Si donor concentration $1 \times 10^{17}$ cm$^{-3}$, thickness 50 nm).

AuGe, Ni and Au metals were deposited on the GaAs layer 133, and then the source electrode 112 and the drain electrode 114 were formed with a space of 5 μm by means of lift-off process. Further, heat treatment was performed at 420° C. under nitrogen atmosphere to form ohmic-contact.

Next, the GaAs layer 133 with a width of 2.5 μm from the center between the source electrode 112 and the drain electrode 114 was selectively removed using a resist as a mask. For the removal of GaAs, dry etching using a gas containing chlorine and fluorine was used.

Next, a SiO$_2$ film with the film thickness of 100 nm was formed as the first insulating film 115, for instance, by using thermal CVD method, and then the region of the first insulating film 115 where the gate electrode was to be formed was opened by dry etching. Ti and Al were deposited in order recited, and then lift-off process was performed to form an integral type electrode of the gate electrode 113 and the first field plate electrode 116. The gate length Lg of the gate electrode 113 was set to 1.0 μm, and the Lfp1 of the first field plate electrode 116 was set to 0.8 μm.

Figure 8:
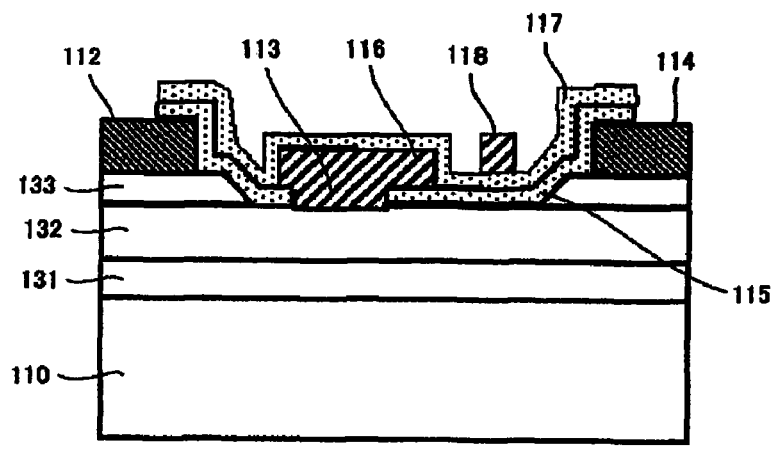
FIG. 8 is a cross sectional view showing one structure of plural types of electric field transistors having difference in parameter Lfd, which were fabricated in Example 2.

Further, a SiN film with the film thickness of 150 nm was deposited as the second insulating film 117. Subsequently, Ti, Pt and Au films were deposited in order recited on the upper surface of the second insulating film 117, and then lift-off process was performed to form the second field plate electrode 118 of Lfp2=1.0 μm. At this time, devices different in the cross-section length Lfd, i.e. Lfd=−0.5 μm, −0.25 μm, +0.25 μm, +0.5 μm, +0.75 μm and +1.0 μm were fabricated. In the case of Lfd=0, the side surfaces of the second insulating film 117 and the second field plate 118 are in contact with each other. In the case of Lfd<0, these members are spaced to each other (FIG. 8). In the subsequent step of wiring, the second field plate electrode 118 and the source electrode 112 were electrically connected in the isolation region.

Figure 6:
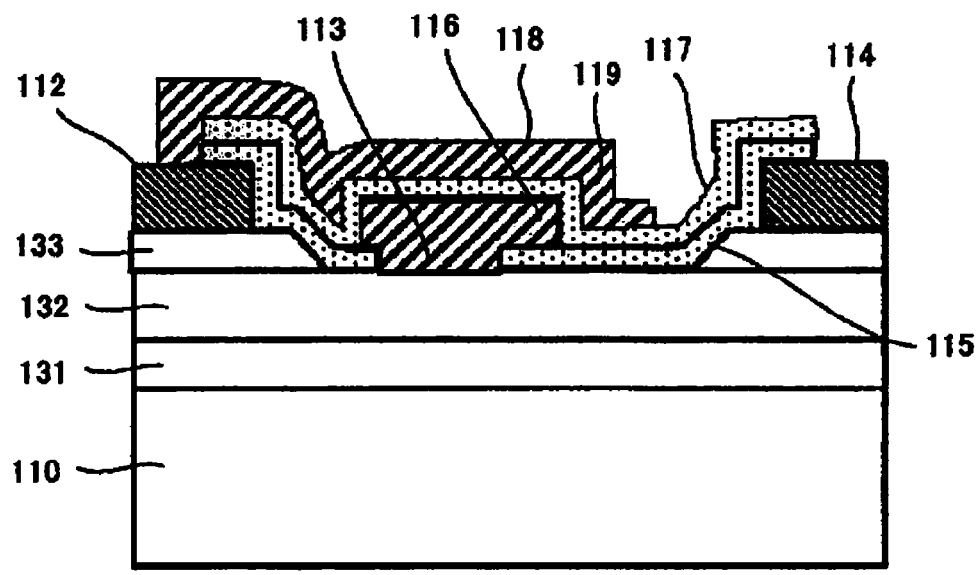
FIG. 6 is a cross sectional view showing one structure of plural types of field effect transistors having difference in parameter Lfd, which were fabricated in Example 2.

Moreover, for comparison, in the wiring step, a sample where the second field plate electrode 118 was electrically connected to the source electrode 112 in the operation layer region (shown in FIG. 6) (source-drain distance Lsd=1.0 μm, Lfd=1.5 μm) was also fabricated.

Figure 7:
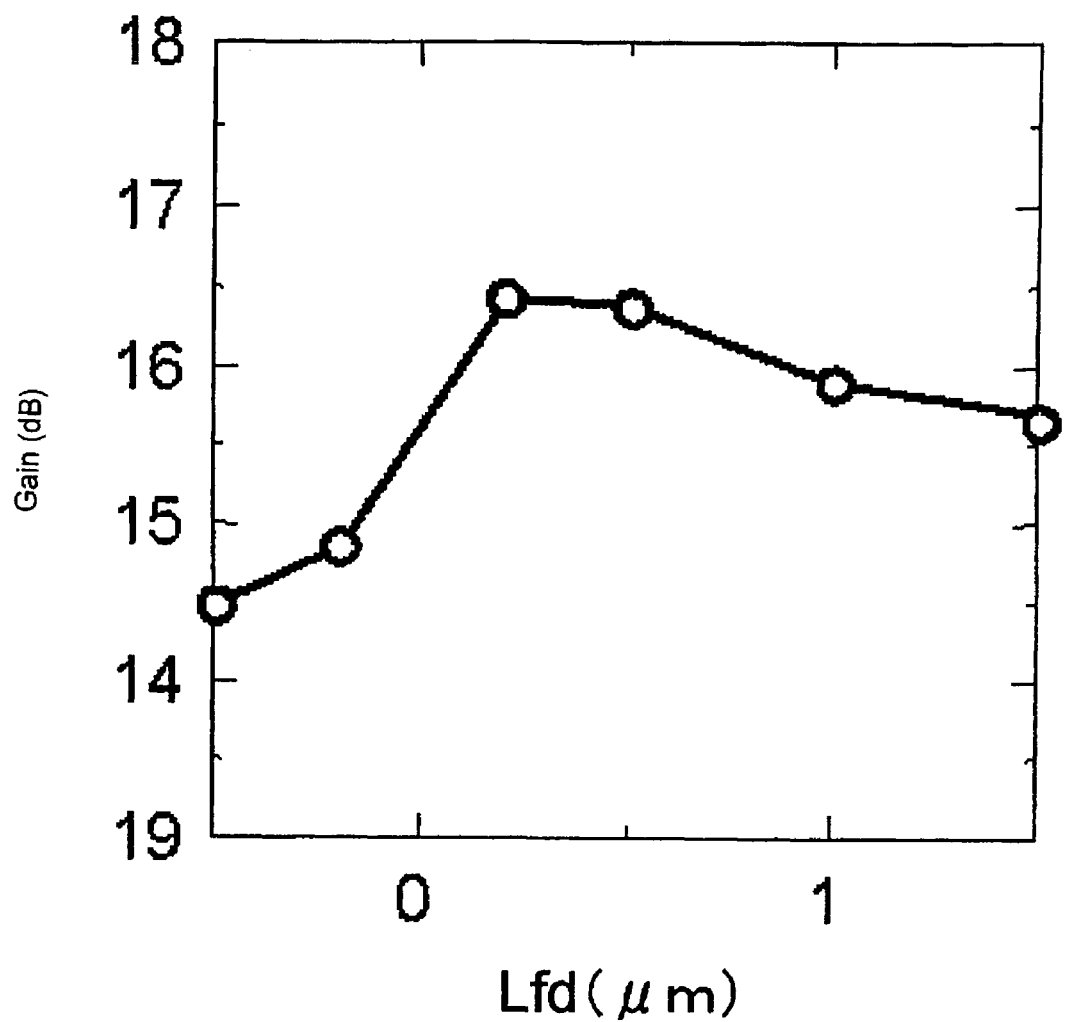
FIG. 7 is a chart showing the relationship between parameter Lfd and gain of transistor evaluated by using plural types of field effect transistors having difference in parameter Lfd, which were fabricated in Example 2.

The Lfd dependency of the linear gain obtained from the evaluation results of power performance at the operating frequency of 1.5 GHz measured for the obtained transistors is shown in FIG. 7.

The gain was about 15 dB (as shown in FIG. 4) also at an operating voltage of 15 V or more in the conventional type of transistor, whereas, as shown in FIG. 7, in the case where the cross-section length Lfd through the second insulating film 117 between a structure comprising the gate electrode 113 and the first field plate electrode 116, and the second field plate electrode 118 is negative (FIG. 8), since the shielding effect of the second field plate electrode 118 is small, reduction of feedback capacity between the gate electrode and the drain electrode is not sufficient so that improvement in the gain is not observed. To the contrary, when the cross-section length Lfd is zero or positive value (Lfd≧0), remarkable improvement in gain is exhibited.

Example 3

In the present example, with respect to the transistor shown in FIG. 5, the relationship between the length Lfp1 of the first field plate electrode 116 and the length Lfp 2 of the second field plate electrode 118 was examined.

Also in the present example, as the semiconductor substrate 110, a high resistance GaAs (semi-insulating GaAs) substrate was used. As layers corresponding to the compound semiconductor 111, there were formed the GaAs layer 131 (thickness 400 nm), the AlGaAs layer 132 (Al composition ratio 0.20, thickness 30 nm), and the GaAs layer 133 (Si donor concentration $1 \times 10^{17}$ cm$^{-3}$, thickness 50 nm). The source electrode 112 and the drain electrode 114 were formed on the GaAs layer 133 with a space of 5 μm. AuGe, Ni and Au metals were deposited at an interval of 5 μm, and these electrodes were formed by means of lift-off process. Further, heat treatment was performed at 420° C. under nitrogen atmosphere to form ohmic-contact.

The GaAs layer 133 with a width of 2.5 μm from the center between the source electrode 112 and the drain electrode 114 is selectively removed using a resist as a mask. For the removal of GaAs, dry etching using a gas containing chlorine and fluorine was used.

Subsequently, a SiO$_2$ film with the film thickness of 100 nm was formed as the first insulating film 115 by using thermal CVD process, and then the region of the first insulating film 115 where the gate electrode 113 was to be formed was opened by dry etching. Ti and Al were deposited in order recited, and then lift-off process was performed to form an integral type electrode of the gate electrode 113 and the first field plate electrode 116. The gate length Lg of the gate electrode 113 was set to 1.0 μm, and the Lfp1 of the first field plate electrode 116 was set to 0.8 μm.

Further, as the second insulating film 117, SiN with the film thickness of 200 nm (d3=0.2 μm) was deposited so that. Ti, Pt and Au films were deposited in order recited on the upper surface of the second insulating film 117, and then lift-off process was performed to form the second field plate electrode 118 of Lfd=+0.75 μm. At this time, devices different in length Lfp2 of the second field plate electrode 118, specifically, devices with Lfp2=0 μm, 0.16 μm, 0.40 μm, 0.8 μm, 1.2 μm and 1.6 μm were fabricated. In the subsequent step of wiring, the second field plate electrode 118 and the source electrode 112 are electrically connected in the isolation region.

Figure 9:
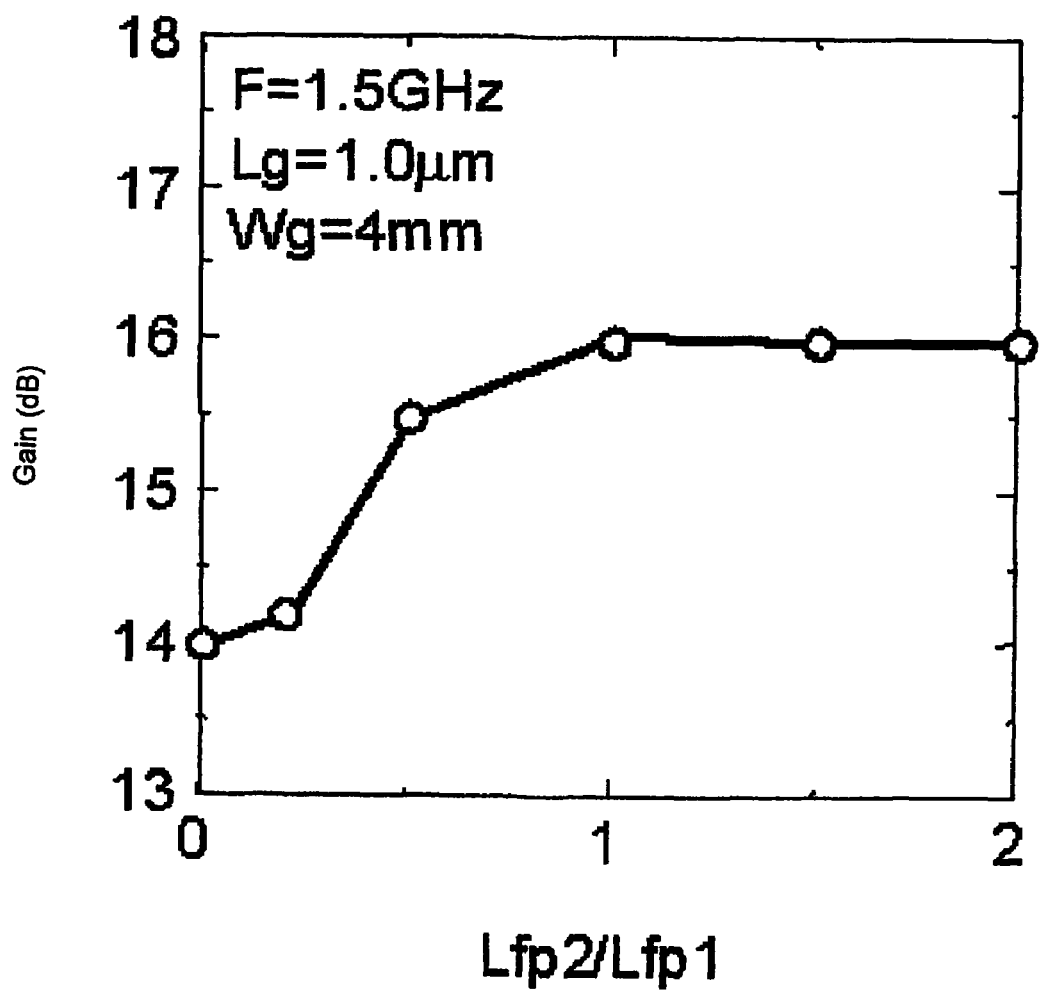
FIG. 9 is a chart showing the relationship between parameters Lfp1, Lfp2 and gain of the transistor evaluated by using plural types of field effect transistors having difference in parameter Lfd, which were fabricated in Example 3.

The Lfp2 dependency of linear gain obtained from the evaluation results of the power performance at the operating frequency 1.5 GHz was examined for the obtained transistors (as shown in FIG. 5). FIG. 9 is a chart showing the results.

From FIG. 9, in the structure in which, in regard to the ratio between the length Lfp1 of the first field plate electrode 116 and the length Lfp2 of the second field plate electrode 118, 0.5≦Lfp2/Lfp1, i.e., the aforementioned formula (I) is satisfied, shielding effect by shielding of lines of electric force is high, and thus feedback capacity between the gate electrode and the drain electrode is reduced so that remarkable improvement in gain is achieved.

Example 4

In the present example, the maximum value of the length Lfp2 of the second field plate electrode 118 was examined for the field effect transistor shown in FIG. 5.

Also in the present example, as the semiconductor substrate 110, a high resistance GaAs (semi-insulating GaAs) substrate was used. As layers corresponding to the compound semiconductor 111, there were formed the GaAs layer 131 (thickness 400 nm), the AlGaAs layer 132 (Al composition ratio 0.20, thickness 30 nm) and the GaAs layer 133 (Si donor concentration $1 \times 10^{17}$ cm$^{-3}$, thickness 50 nm).

The source electrode 112 and the drain electrode 114 were formed with a space of 5 μm. In particular, AuGe, Ni and Au metals were deposited in order, and then these electrodes were formed through lift-off process. Further, heat treatment was performed at 420° C. under nitrogen atmosphere to form ohmic-contact.

Next, the GaAs layer 133 with a width of 2.5 μm from the center between the source electrode 112 and the drain electrode 114 is selectively removed using a resist as a mask. The removal of GaAs was performed by dry etching using a gas containing chlorine and fluorine.

Subsequently, a SiO$_2$ film with the film thickness of 100 nm was formed as the first insulating film 115, for instance, by means of thermal CVD method, and then the region of the first insulating film 115 where the gate electrode 113 was to be formed was opened by dry etching. Ti and Al were deposited in order recited, and then lift-off process was performed to form an integral type electrode of the gate electrode 113 and the field plate electrode 116. The gate length Lg of the gate electrode 113 was set to 1.0 μm, and the Lfp1 of the first field plate electrode 116 was set to 0.3 μm.

Further, as the second insulating film 117, SiN with the film thickness of 200 nm was deposited. Ti, Pt and Au films were deposited in order recited on the upper surface of the second insulating film 117, and then lift-off process was performed to form the second field plate electrode 118 having Lfd=+0.75 μm. At this time, devices different in length Lfp2 of the second field plate electrode 118, specifically, devices with Lfp2=0 μm, 0.3 μm, 0.9 μm, 1.6 μm, and 2.3 μm were fabricated. At those cases, the length Lgr between the gate electrode 113 and the drain end of the recess bottom surface of the GaAs layer 133 was set to 3.5 μm in the cross sectional view in the gate length direction. In the subsequent step of wiring, the second field plate electrode 118 and the source electrode 112 were electrically connected in the isolation region.

In addition, a field effect transistor of Lfp1=0 μm, Lfp2=0 μm was fabricated for comparison.

Figure 10:
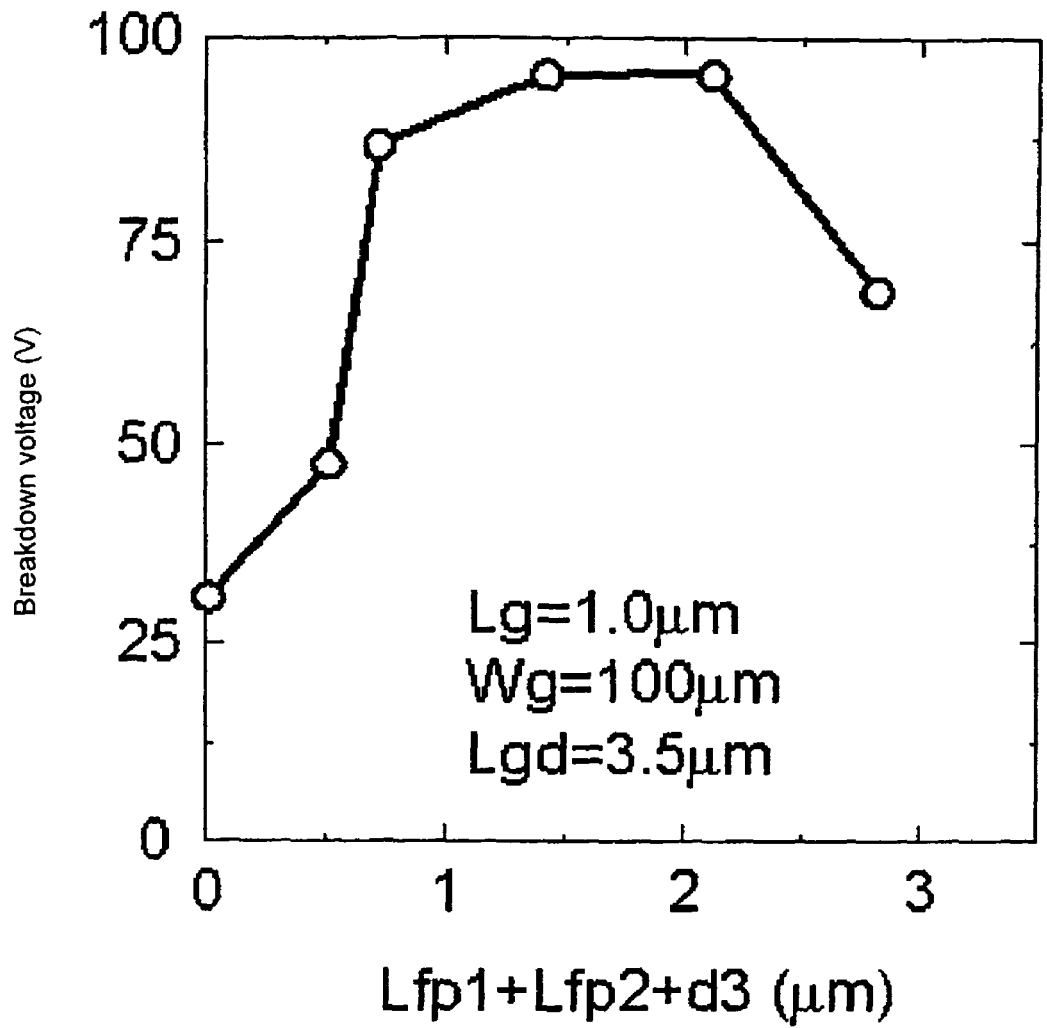
FIG. 10 is a chart showing the relationship between parameters Lfp1, Lfp2, d3 and breakdown voltage of the transistor evaluated by using plural types of field effect transistors having difference in parameter Lfd, which were fabricated in Example 4.

FIG. 10 is a chart showing evaluation results of breakdown voltage measured for the obtained transistors. From FIG. 10, when, in the case where the length Lfp1 of the first field plate electrode 116 was 0.3 μm and the thickness d3 of the second insulating film 117 on the side surface of the first field plate electrode 116 was 0.2 μm, the length Lfp2 of the second field plate electrode 118 increased from 0 up to 0.3 μm, and thus Lfp1+Lfp2+d3 increased up to 0.8 μm, the breakdown voltage was remarkably improved so that it became as high as 80 V. Moreover, when Lfp2 increased to 2.3 μm so that Lfp1+Lfp2+d3 became equal to 2.8 μm, the breakdown voltage is abruptly lowered down to 70 V. It is considered that when Lfp1+Lfp2+d3 was larger than ⅗×Lgr with respect to Lgr (=3.5 μm), electric field concentration of the drain end of the second field plate electrode 118 became large so that the breakdown voltage was lowered. Accordingly, with use of a structure which satisfies:

$$Lfp1+Lfp2+d3 \leq \tfrac{3}{5} \times Lgr, \quad (2)$$

it is possible to further improve the breakdown voltage.

Example 5

In the present example, in the field effect transistor shown in FIG. 5, the length Lfp2 of the second field plate electrode 118 and the thickness d2 of the second insulating film 117 were examined.

Also in the present example, as the semiconductor substrate 110, a high resistance GaAs (semi-insulating GaAs) substrate was used. As layers corresponding to the compound semiconductor 111, there were formed the GaAs layer 131 (thickness 400 nm), the AlGaAs layer 132 (Al composition ratio 0.20, thickness 30 nm), and the GaAs layer 133 (Si donor concentration $1 \times 10^{17}$ $cm^{-3}$, thickness 50 nm).

Next, the source electrode 112 and the drain electrode 114 were formed on the GaAs layer 133 with a spacel of 5 μm. AuGe, Ni and Au metals were deposited in order, and then these electrodes were formed by means of lift-off process. Further, heat treatment was performed at 420° C. under nitrogen atmosphere to form ohmic-contact.

The GaAs layer 133 with a width of 2.5 μm from the center between the source electrode 112 and the drain electrode 114 was selectively removed using a resist as a mask. The removal of GaAs was performed by dry etching using a gas containing chlorine and fluorine. Thereafter, $SiO_2$ with the film thickness of 100 nm was deposited as the first insulating film 115, for instance, by means of thermal CVD method, and then the region where the gate electrode 113 was to be formed was opened by dry etching. Further, the integral type electrode of the gate electrode 113 and the first field plate electrode 116 were formed by depositing Ti and Al and then performing lift-off process. The gate length Lg of the gate electrode 113 was set to 1.0 μm, and Lfp1 of the first field plate electrode 116 was set to 0.8 μm.

Subsequently, there were respectively fabricated samples of devices in which $SiO_2$ films were formed as the second insulating film 117 with the film thicknesses of 0.1 μm, 0.3 μm, 0.5 μm and 0.7 μm, respectively; Ti, Pt and Au films were deposited in order on the upper surface of the second insulating film 117, and then lift-off process was perform to form second field plate electrode 118. The Lfp2 of the second field plate electrode 118 was set to 1.0 μm. Moreover, there were also fabricated such samples in which a portion of a sample where the thickness of $SiO_2$ was set to 0.1 μm was divided to remove $SiO_2$ by etching, or to subsequently remove, by etching, 50 nm of 100 nm of the first insulating film 115, and then the second field plate electrode 118 of Lfp2=1.0 μm was formed on the upper surface thereof (shown in FIG. 11). Thereafter, in the step of wiring, the second field plate electrode 118 and the source electrode 112 were electrically connected in the isolation region.

Figure 12:
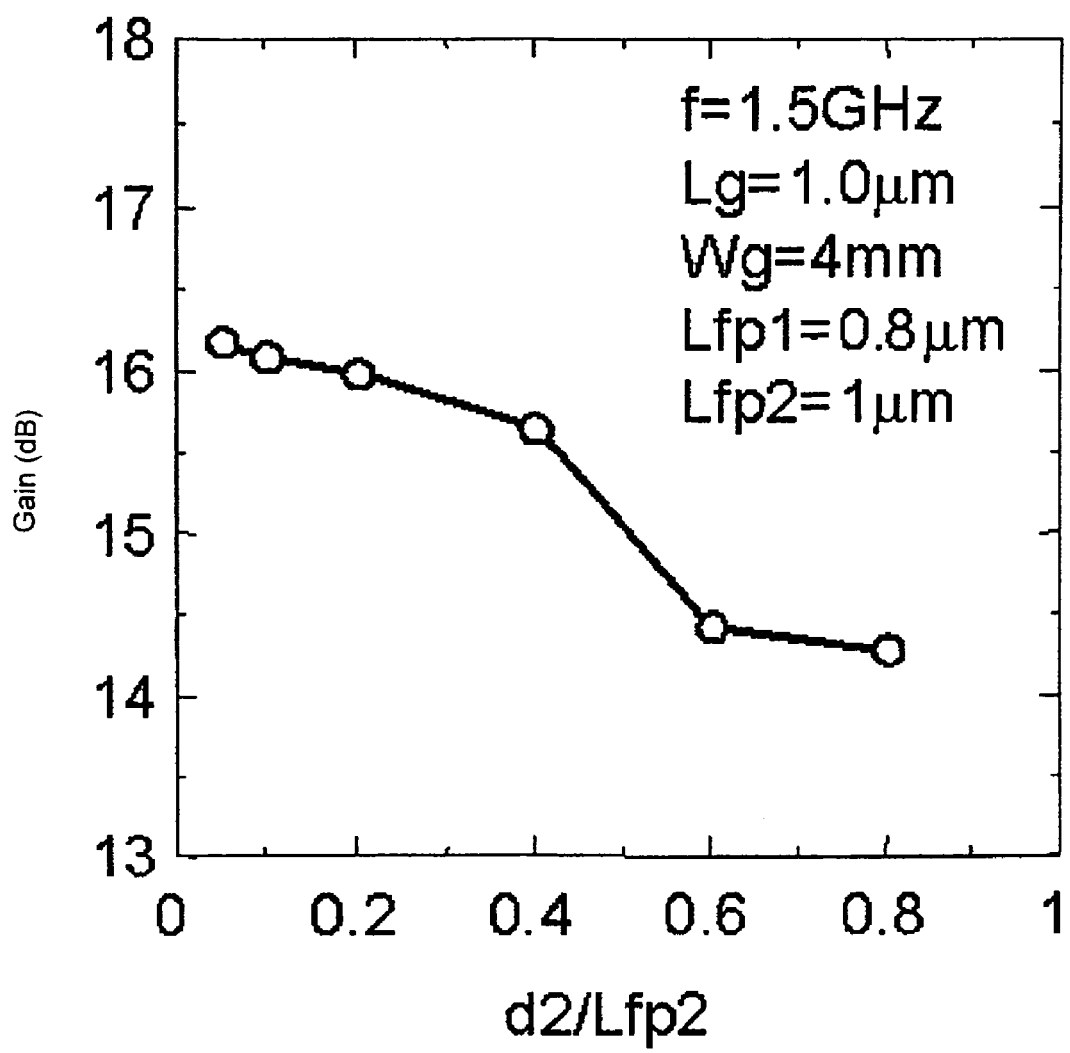
FIG. 12 is a chart showing the relationship between parameters d2, Lfp2 and gain of the transistor evaluated by using plural types of field effect transistors having difference in parameter Lfd, which were fabricated in Example 5.

FIG. 12 shows the d2/Lfp2 dependency of linear gain obtained from the evaluation results of power performance at an operating frequency 1.5 GHz measured for the obtained transistors. From FIG. 12, when the relation expressed as d2/Lfp2≦½ holds, shielding effect by the second field plate electrode 118 was exhibited, and thus, the gain was remarkably improved.

Example 6

Figure 13:
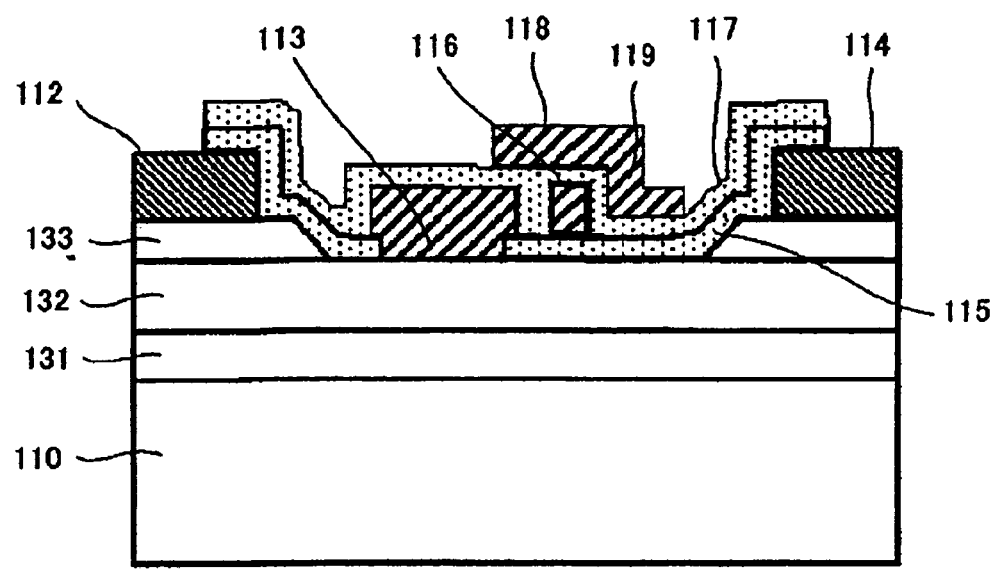
FIG. 13 is a cross sectional view showing the structure of a field effect transistor according to a further exemplary embodiment of the present invention.

FIG. 13 is a cross sectional view showing the structure of the field effect transistor of the present example. The fundamental structure of the field effect transistor shown in FIG. 13 is very similar to that of the field effect transistor shown in FIG. 1 which has been referred to in the second exemplary embodiment, but there is such a difference that the device shown in FIG. 13 is constructed in a so-called wide recess structure.

As the semiconductor substrate 110, a high resistance GaAs (semi-insulating GaAs) substrate was used. As layers corresponding to the compound semiconductor 111, there were formed the GaAs layer 131 (thickness 400 nm), the AlGaAs layer 132 (Al composition ratio 0.20, thickness 30 nm), and the GaAs layer 133 (Si donor concentration $1 \times 10^{17}$ $cm^3$, thickness 50 nm).

The source electrode 112 and the drain electrode 114 were formed with a space of 5.5 μm. Here, AuGe, Ni and Au metals were deposited in order, and then lift-off process was performed to form these electrodes. Further, heat treatment was performed at 420° C. under nitrogen atmosphere to thereby form ohmic-contact. The GaAs layer 133 with a width of 2.5 μm from the center between the source electrode 112 and the drain electrode 114 was selectively removed using a resist as a mask. The removal of GaAs was performed by dry etching using a gas containing chlorine and fluorine. Further, a $SiO_2$ film with the film thickness of 100 nm was formed as the first insulating film 115 by using thermal CVD method, and then the region where the gate electrode 113 was to be formed was opened by dry etching.

The gate electrode 113 was formed in such a structure which is filling up the opening part thus obtained and further hanging over the first insulating film 115 by 0.2 μm. The gate length of the gate electrode 113 was set to 1.0 μm. As a metal for the gate electrode 113, there was deposited Pt with a barrier height higher than that of conventional Ti (lower layer)/Al (upper layer) metals, and a small gate leakage current, and then the gate electrode 113 was formed by means of the lift-off process using a resist. Next, the first field plate electrode 116 was formed as a conductive member different from the gate electrode 113 with a size of Lfp1=0.8 μm. In this case, Ti, Pt and Au which are excellent in adhesion with respect to the first insulating film 115 were deposited in order, and then lift-off process was performed to form the electrode. By using metallic materials respectively suitable for the gate electrode 113 and the first field plate electrode 116 in this way, it is possible to further notably improve the performance of the transistor and the manufacturing yield thereof.

Next, as the second insulating film 117, SiN was deposited with the film thickness of 150 nm. On the upper surface thereof, there was formed, by deposition and lift-off processes, a Ti/Pt/Au electrode with Lfd=0.4 μm and Lfp2= 1.0 μm as the second field plate electrode 118. In the subsequent step of wiring, the second field plate electrode 118 and the source electrode 112 were electrically connected in the isolation region.

The field effect transistor thus obtained was evaluated, and was compared to that of Example 1. In particular, as the result of the evaluation of power performance at 1.5 GHz according to the procedure described in Example 1, the device was found to exhibit a power performance in comparable level to that of Example 1. Since application of a material optimum for the gate electrode was possible, improvement in the long-term stability of the device due to the reduction of gate leakage current was further increased.

Furthermore, In the present example, after ohmic-contact was formed, SiN with the thickness of 100 nm was formed by means of plasma CVD method as the first insulating film 115, and then a T-shaped gate electrode with the gate length of 1.0 μm was formed at an opening obtained by dry-etching. As another method of forming the gate electrode 113 and the first insulating film 115, it was possible to form, after forming of the ohmic-electrode, the rectangular shaped gate electrode 113 with the gate length of 1.0 µm by deposition and lift-off processes, and then a SiN film with the film thickness of 100 nm as the first insulating film 115, for instance, by means of plasma CVD method.

Moreover, while it has been described in the present example that it was possible to form the rectangular shaped gate electrode 113 with the gate length of 1.0 µm by deposition and lift-off processes, and then a SiN film with the film thickness of 100 nm as the first insulating film 115, for instance, by means of plasma CVD method, it was also possible to use WSi which is made of a high refractory metal as the rectangular shaped gate electrode 113.

In this case, as the semiconductor substrate 110, a high resistance GaAs (semi-insulating GaAs) substrate was used. As layers corresponding to the compound semiconductor 111, there were formed, e.g., an AlGaAs buffer layer (not shown) (100 nm), the GaAs layer 131 (400 nm), the AlGaAs layer 132 (Al composition ratio 0.20, thickness 30 nm), and the GaAs layer 133 (Si donor concentration $1 \times 10^{17}$ cm$^{-3}$, thickness 50 nm). Next, the GaAs layer 133 with a width of 2.5 µm was selectively removed using a resist as a mask. The removal of GaAs was performed by dry etching using a gas containing chlorine and fluorine.

Further, WSi metal with a thickness of 500 nm was deposited on the entire surface of the semiconductor substrate 110 by using sputtering method. Subsequently, by dry etching using a fluorine-based gas using a resist as a mask, WSi metal except for the region where the gate electrode 113 was to be formed was removed by etching. Further, the source electrode 112 and the drain electrode 114 were formed. AuGe, Ni and Au metals were deposited, and then lift-off process was performed to form these electrodes followed by performing heat treatment at 420° C. under nitrogen atmosphere to thereby form ohmic-contact.

In the following examples, explanation will be made mainly as to points different from Example 6.

Example 7

In the present example, the influence on the shielding effect of the Lfd: cross-section length between the structure composed of the first field plate electrode 116 and the gate electrode 113 and the second field plate electrode 118 through an insulating film was examined by using the procedure described in Example 2.

Figure 14:
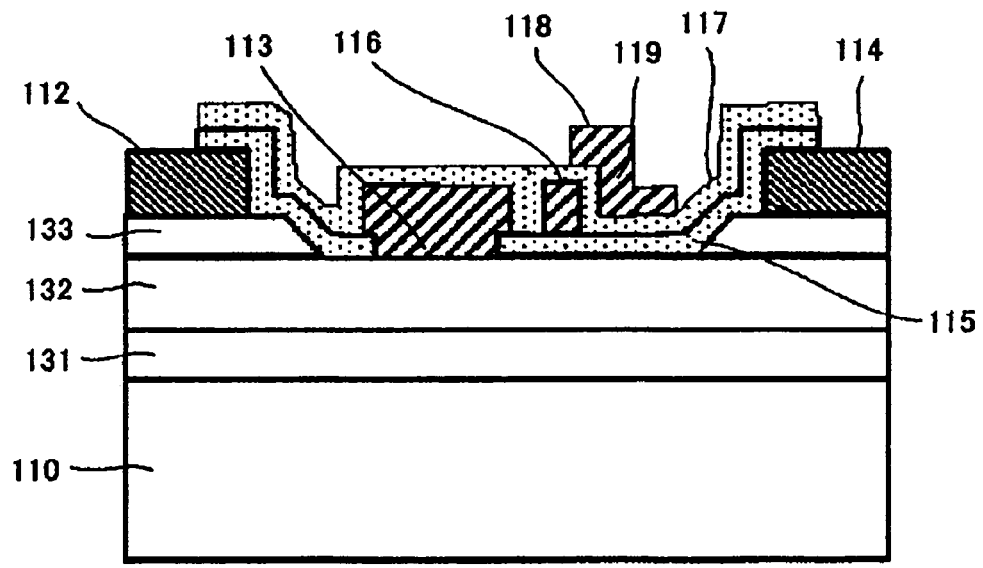
FIG. 14 is a cross sectional view showing one structure of plural types of field effect transistors having difference in parameter Lfd, which were fabricated in Example 7.

FIG. 14 is a cross sectional view showing the structure of the field effect transistor of the present example. Also in the present example, a high resistance GaAs (semi-insulating GaAs) substrate was used as the semiconductor substrate 110. On the semiconductor substrate 110, as layers corresponding to the compound semiconductor 111, an AlGaAs buffer layer (not shown) (100 nm), the GaAs layer 131 (400 nm), the AlGaAs layer 132 (Al composition ratio 0.20, thickness 30 nm), and the GaAs layer 133 (Si donor concentration $1 \times 10^{17}$ cm$^{-3}$, thickness 50 nm) were formed in order recited from the lower side.

The source electrode 112 and the drain electrode 114 were formed with a space of 5.5 µm. Here, AuGe, Ni and Au metals were deposited, and then the lift-off process was performed to form these electrodes. Further, heat treatment was performed at 420° C. under nitrogen atmosphere to form ohmic-contact. The GaAs layer 133 with a width of 2.5 µm from the center between the source electrode 112 and the drain electrode 114 was selectively removed using a resist as a mask. The removal of GaAs was performed by dry etching using a gas containing chlorine and fluorine. Thereafter, a SiO$_2$ film with the film thickness of 100 nm was formed by using CVD method as the first insulating film 115, and then the region where the gate electrode 113 was to be formed was opened by dry etching.

At the opening part provided at the SiO$_2$ film, there was formed the gate electrode 113 with gate length Lg=1.0 µm in such a structure hanging over the first insulating film 115 by 0.2 µm. As a metal for the gate electrode 113, there was deposited Pt with a barrier height higher than that of the conventional Ti/Al metals and a small gate leakage current. By using the resist lift-off process, gate electrode 113 was formed.

Next, the first field plate electrode 116 with Lfp1=0.8 µm was formed. Specifically, Ti, Pt and Au which are excellent in adhesion with respect to the first insulating film 115 were deposited in order, and then lift-off process was performed to form the first field plate electrode 116. Further, a SiN film with the film thickness of 200 nm was formed as the second insulating film 117, and further a Ti/Pt/Au electrode was formed as the second field plate electrode 118. At this time, devices different in length of Lfd, i.e. with Lfd=−0.5 µm, −0.25 µm, +0.25 µm, +0.5 µm, +0.75 µm and +1.0 µm were respectively fabricated. In the subsequent step of wiring, the second field plate electrode 118 and the source electrode 112 were electrically connected in the isolation region.

As the result of the fact that the Lfd dependency of linear gain was determined by using the method described in Example 2 from the evaluation result of power performance at the operating frequency 1.5 GHz measured for the obtained transistors, there was a tendency similar to that of Example 2. In the case where the Lfd: cross-section length between the first field plate electrode 116 and the second field plate electrode 118 through the insulating film was negative, effect of the second field plate electrode 118 was small so that improvement in gain was not observed, whereas when the cross-section length Lfd was positive value, remarkable improvement in gain was observed.

Example 8

In the present example, with respect to the field effect transistor shown in FIG. 14, the relationship between the length Lfp 1 of the first field plate electrode 116 and the length Lfp 2 of the second field plate electrode 118 was examined by using the procedure described in Example 3.

Also in the present example, as the semiconductor substrate 110, a high resistance GaAs (semi-insulating GaAs) substrate was used. As layers corresponding to the compound semiconductor 111, there were formed an AlGaAs buffer layer (not shown) 100 nm, the GaAs 131 layer 400 nm, the AlGaAs layer 132 (Al composition ratio 0.20, thickness 30 nm), and the GaAs layer 133 (Si donor concentration $1 \times 10^{17}$ cm$^{-3}$, thickness 50 nm).

The source electrode 112 and the drain electrode 114 with a space of 5.5 µm were formed on the GaAs layer 133. Specifically, AuGe, Ni and Au metals were deposited in order, and then lift-off process was performed to form these electrodes, followed by performing heat treatment at 420° C. under nitrogen atmosphere to form ohmic-contact.

Subsequently, the GaAs layer 133 with a width of 2.5 µm from the center between the source electrode 112 and the drain electrode 114 was selectively removed using a resist as a mask. The removal of GaAs was performed by dry etching using a gas containing chlorine and fluorine. Further, SiO$_2$ with the film thickness of 100 nm was deposited as the first insulating film 115 by using thermal CVD method, and then the region where the gate electrode 113 was to be formed was opened by dry etching.

At the opening part provided at the first insulating film 115, there was formed gate electrode 113 with the gate length Lg=1.0 μm in such a structure hanging over the first insulating film 115 by 0.2 μm. As a metal for the gate electrode 113, there was deposited Pt with a barrier height higher than that of conventional Ti/Al metals and a small gate leakage current, and then resist lift-off process was used to form the gate electrode 113. Next, the first field plate electrode 116 with Lfp1=0.8 μm was formed. The formation of the first field plate electrode 116 was carried out by depositing Ti, Pt and Au in order, which are excellent in adhesion with respect to the first insulating film 115, and performing lift-off process. At this case, the distance Lgr between the gate electrode 113 and the drain end of the recess bottom surface of the GaAs layer 133 was set to 3.5 μm.

Next, as the second insulating film 117, SiN was deposited with the film thickness of 200 nm (d3=0.2 μm). On the upper surface of the SiN film, there was formed the second field plate electrode 118. The formation of the second field plate electrode 118 was carried out by depositing Ti, Pt and Au films, and performing lift-off process. At this case, devices different in length Lfp2 of the second field plate electrode 118, specifically, devices with Lfp2=0 μm, 0.16 μm, 0.40 μm, 0.8 μm, 1.2 μm and 1.6 μm were respectively fabricated. In the subsequent step of wiring, the second field plate electrode 118 and the source electrode 112 were electrically connected in the isolation region.

With respect to the obtained field effect transistors, according to the similar procedure to that descried in Example 3, evaluation of the power performance at the operating frequency 1.5 GHz was performed to determine Lfp2 dependency of linear gain. As a result, similarly to the devices of Example 3, with a structure to satisfy the relation expressed as 0.5≦Lfp2/Lfp1 in connection with the ratio between the length Lfp1 of the first field plate electrode 116 and the length Lfp2 of the second field plate electrode 118, shielding effect of lines of electric force is high, so that feedback capacity between the gate electrode and the drain electrode is reduced, and thus, it was possible to obtain remarkable improvement in gain.

In addition, in the present example, there were used metallic materials respectively suitable for the gate electrode 113 and the first field plate electrode 116. Thus, performance and yield of the transistor were remarkably improved.

Example 9

In the present example, with respect to the field effect transistor shown in FIG. 14, the maximum value of the length Lfp2 of the second field plate electrode 118 was examined by using the procedure described in Example 4.

Also in the present example, as the semiconductor substrate 110, a high resistance GaAs (semi-insulating GaAs) substrate was used. As layers corresponding to the compound semiconductor 111, there were formed an AlGaAs buffer layer (not shown) (100 n), the GaAs layer 131 (400 nm), the AlGaAs layer 132 (Al composition ratio 0.20, thickness 30 nm), and the GaAs layer 133 (Si donor concentration $1 \times 10^{17}$ cm$^{-3}$, thickness 50 nm).

The source electrode 112 and the drain electrode 114 were formed on the GaAs layer 133 with a space of 5.5 μm. Here, AuGe, Ni and Au were deposited in order as metal, and then lift-off process was used to form these electrodes, followed by heat treatment at 420° C. under nitrogen atmosphere to form ohmic-contact. Further, the GaAs layer 133 with a width of 2.5 μm from the center between the source electrode 112 and the drain electrode 114 was selectively removed using a resist as a mask. The removal of GaAs was performed by dry etching using a gas containing chlorine and fluorine.

Subsequently, a SiO$_2$ film with the film thickness of 100 nm was formed as the first insulating film 115 by using thermal CVD method, and then the region where the gate electrode 113 was to be formed was opened by dry etching.

At the opening part provided at the first insulating film 115, there was formed the gate electrode 113 with the gate length Lg=1.0 μm in such a structure hanging over the first insulating film 115 by 0.2 μm. As a metal for the gate electrode 113, there was deposited Pt with a barrier height higher than that of the conventional Ti/Al metals, and a small gate leakage current, and then resist lift-off process was used to form the gate electrode 113. Next, the first field plate electrode 116 with Lfp1=0.3 μm was formed. The formation of first field plate electrode 116 was carried out by depositing, in order, Ti, Pt and Au which are excellent in adhesion with respect to the first insulating film 115, and performing lift-off process. At this case, the distance Lgr between the gate electrode 113 and the drain end of the recess bottom surface of the GaAs layer 133 was set to 4.0 μm.

Next, SiN was deposited as the second insulating film 117 with the film thickness of 200 nm. After the second field plate electrode 118 with Lfd=+0.75 μm was formed on the upper surface of the second insulating film 117, a Ti, Pt and Au electrode was formed by deposition and lift-off processes. At this case, devices different in length Lfp2 of the second field plate electrode 118 (i.e. with Lfp2=0 μm, 0.3 μm, 0.9 μm, 1.6 μm and 2.3 μm) were fabricated.

As the result of the fact that breakdown voltages of the obtained transistors were evaluated, there was obtained a tendency similar to that obtained in Example 4. In particular, when Lfp1+Lfp2+d3 was ⅗×Lgr or less at the case (Lgr=4.0 μm), it was possible to suppress electric field concentration of the second field plate electrode 118 drain end, and to more suitably suppress lowering of the breakdown voltage. Accordingly, it has been understood that if a necessary structure to satisfy Lfp1+Lfp2+d3≦⅗×Lgr is employed, it is possible to further improve the breakdown voltage.

In addition, in the present example, metallic materials respectively suitable for the gate electrode 113 and the first field plate electrode 116 were used so that the performance and yield of the transistors were remarkably improved.

Example 10

In the present example, with respect to the field effect transistor shown in FIG. 14, the relationship between the length Lfp2 of the second field plate electrode 118 and the thickness d of the second insulating film 117 was examined by using the procedure described in Example 5.

Also in the present example, as the semiconductor substrate 110, a high resistance GaAs (semi-insulating GaAs) substrate was used. As layers corresponding to the compound semiconductor 111, on the semiconductor substrate 110, there were formed in order an AlGaAs buffer layer (not shown) (100 nm), the GaAs layer 131 (400 nm), the AlGaAs layer 132 (Al composition ratio 0.20, thickness 30 nm), and the GaAs layer 133 (Si donor concentration $1 \times 10^{17}$ cm$^{-3}$, thickness 50 nm). The source electrode 112 and the drain electrode 114 were formed with a space of 5.5 μm. Here, AuGe, Ni and Au metals were deposited in order, and then lift-off process was used to form these electrodes, followed by performing heat treatment at 420° C. under the nitrogen atmosphere to form ohmic-contact.

Further, the GaAs layer 133 with a width of 2.5 μm from the center between the source electrode 112 and the drain electrode 114 was selectively removed using a resist as a mask. The removal of GaAs was performed by dry etching using a gas containing chlorine and fluorine. Thereafter, a $SiO_2$ film with the film thickness of 100 nm was formed as the first insulating film 115 by using thermal CVD method, and then the region where the gate electrode 113 was to be formed was opened by dry etching.

At the opening part provided at the first insulating film 115, there was formed gate electrode 113 with gate length Lg=1.0 μm in such a structure hanging over the first insulating film 115 by 0.2 μm. As a metal for the gate electrode 113, there was deposited Pt with a barrier height higher than that of conventional Ti/Al metals and a small gate leakage current, and then resist lift-off process was used to form the gate electrode 113. Next, the first field plate electrode 116 was formed with a size of Lfp1=0.8 μm. The formation of the first field plate electrode 116 was carried out by depositing Ti, Pt and Au in order, which are excellent in adhesion with respect to the first insulating film 115, and performing lift-off process. At this case, the distance Lgr between the gate electrode 113 and the drain end of the recess bottom surface was set to 4.0 μm.

Figure 15:
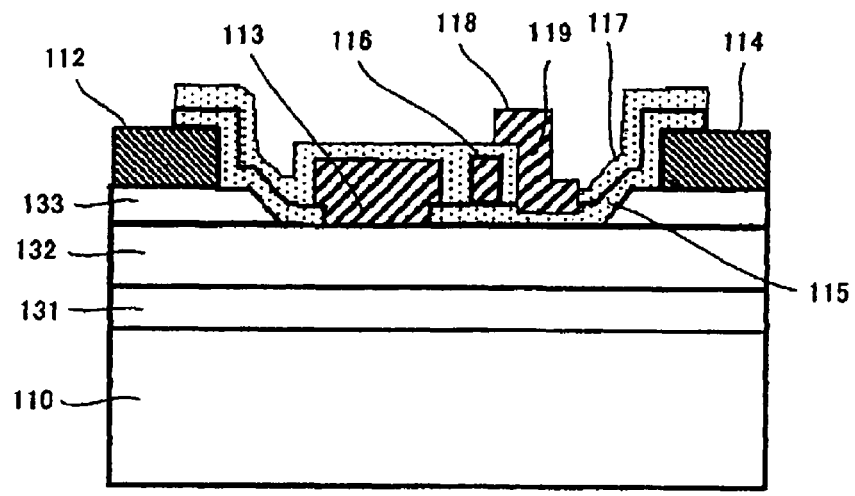
FIG. 15 is a cross sectional view showing the structure of a field effect transistor according to a still further exemplary embodiment of the present invention.
Figure 16:
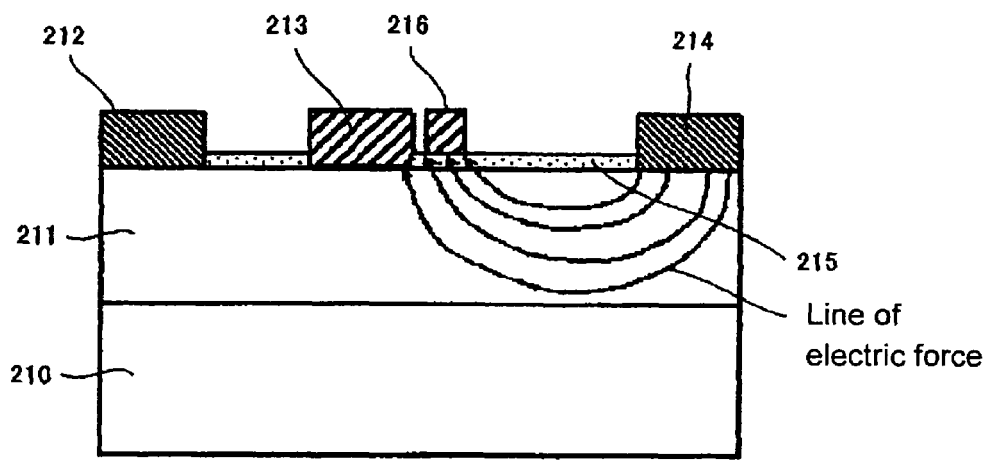
FIG. 16 is a cross sectional view schematically showing the structure of a conventional type of field effect transistor comprising one field plate electrode, and lines of electric force reflecting electric field distribution in the gate-drain region.
Figure 17:
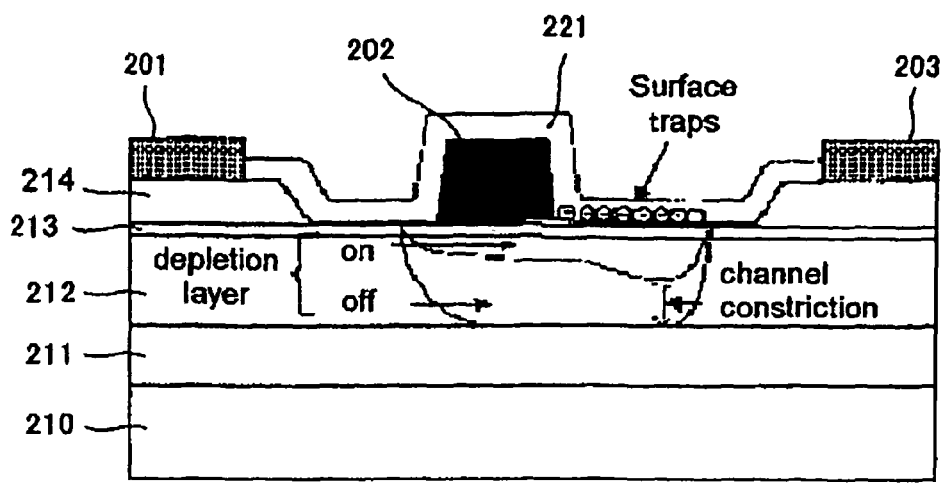
FIG. 17 is a sectional view schematically showing the structure of a conventional type of field effect transistor utilizing a wide recess structure which does not comprises a field plate electrode.
Figure 18:
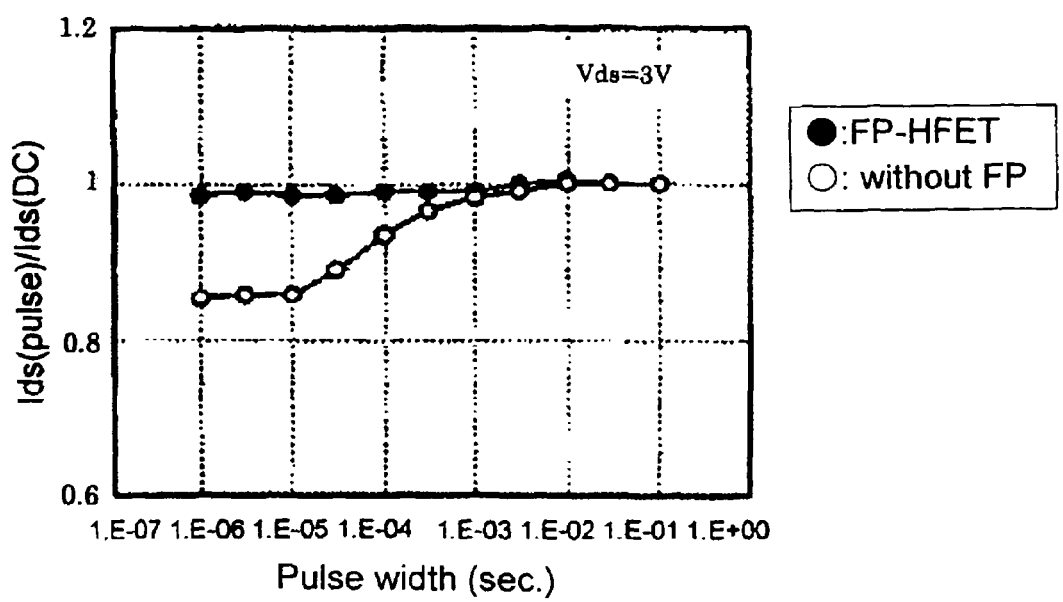
FIG. 18 is a chart showing the effect on the relationship between pulse width and pulse current obtained by employing a field plate electrode, which has been evaluated in a conventional type of field effect transistor.

Further, in the present example, there were fabricated samples where $SiO_2$ films with 0.1 μm, 0.3 μm, 0.5 μm and 0.7 μm were respectively formed as the second insulating film 117. Furthermore, a Ti/Pt/Au electrode was formed by deposition and lift-off processes as the second field plate electrode 118 with Lfp2=1.0 μm on the upper surface of the second insulating film 117. Moreover, there were also fabricated samples in which a portion of the sample with a $SiO_2$ thickness of 0.1 μm was divided to remove $SiO_2$ by etching, or to subsequently remove, by etching, 50 nm of 100 nm of the first insulating film 115, and then, by the deposition and lift-off processes, the second field plate electrode 118 was formed on the upper surface thereof (as shown in FIG. 15). In the subsequent step of wiring, the second field plate electrode 118 and the source electrode 112 were electrically connected in the isolation region.

As the result of the fact that the d2/Lfp2 dependency of linear gain was examined by evaluation of the power performance at the operating frequency 1.5 GHz of the obtained transistors, there was a tendency similar to that observed in Example 5. When the relation expressed as d2/Lfp2≦½ holds, shielding effect by the second field plate electrode 118 was exhibited, and thus, remarkable improvement in gain was made.

In addition, in the present example, as the result of the fact that metallic materials respectively suitable for the gate electrode 113 and the first field plate electrode 116 were used, performance and yield of the transistor were remarkably improved.

The present invention has been described by referring to the exemplary embodiments and the examples. These exemplary embodiments are taken as illustrative purpose, and a person skilled in the art can understand that various modified embodiments may be employed for combinations of respective components or respective processes for treatment, and that such modified embodiments fall within the technical scope of the present invention.

While explanation has been made above by taking an example of an AlGaAs/GaAs-based compound semiconductor transistor, a InAlAs/InGaAs-based transistor, for instance, may be used. Also in such a case, similar effects are attained.

Moreover, while explanation has been made above by taking an example of the case with use of a GaAs substrate, an InP substrate may be used. Also in such a case, similar effects are achieved.

In addition, the field effect transistors disclosed in the aforementioned exemplary embodiments and examples are used as components comprised in an amplifier circuit or an oscillating circuit, for example. Since satisfactory high frequency characteristic is required in such a use, the advantages of the FETs of the present invention are exhibited at the maximum.

The invention claimed is:

1. A field effect transistor, comprising:
   a semiconductor substrate made of GaAs or InP;
   a layer structure made of compound semiconductor provided on the semiconductor substrate;
   a source electrode and drain electrode formed on the layer structure made of compound semiconductor with a space separating each other;
   a gate electrode placed between the source electrode and drain electrode;
   a first field plate placed over the layer structure made of compound semiconductor in a region between the gate electrode and the drain electrode, and isolated from the layer structure made of compound semiconductor; and
   a second field plate placed over the layer structure made of compound semiconductor, and isolated from the layer structure made of compound semiconductor and the first field plate,
   wherein:
   the compound semiconductor is compound semiconductor other than Group III nitride semiconductor;
   the first field plate is biased at the same electric potential as that of the gate electrode;
   the second field plate is biased at the same electric potential as that of the source electrode;
   the second field plate comprises a shielding part located in a region between the first field plate and the drain electrode, and serving to shield the first field plate from the drain electrode; and
   the upper end of the shielding part is located above an upper surface of the first field plate,
   whereby, in a cross sectional view in the gate length direction, when a gate length is designated as Lg; and a length in the gate length direction of an overlap region where the second field plate overlaps an upper part of a structure including the first field plate and the gate electrode is designated as Lol, the relation expressed below is satisfied:

$0 < Lol/Lg \leq 1$.

2. The field effect transistor as claimed in claim 1, wherein the lower end of the shielding part is located nearer to the layer structure made of compound semiconductor than the lower end of the first field plate.

3. The field effect transistor as claimed in claim 2, further comprising:
   a first insulating film for covering a surface of the layer structure made of compound semiconductor in the region between the gate electrode and the drain electrode,
   wherein a recessed part is provided at the first insulating film in the region between the first field plate and the drain electrode, and the first field plate is provided in a manner in contact with an upper surface of the first insulating film, and the lower end of the shielding part is located within the recessed part.

4. The field effect transistor as claimed in claim 1, wherein a lower end of the first field plate is located nearer to the layer structure made of compound semiconductor than the lower end of the shielding part.

5. The field effect transistor as claimed in claim 4, comprising:
   a first insulating film for covering a surface of the layer structure made of compound semiconductor in the region between the gate electrode and the drain electrode; and
   a second insulating film provided on the first insulating film in the region between the first field plate and the drain electrode;
   wherein the first field plate is provided in a manner in contact with an upper surface of the first insulating film, and the lower end of the shielding part is in contact with an upper surface of the second insulating film.

6. The field effect transistor as claimed in claim 1, wherein the first field plate is integrally constructed together with the gate electrode in the monolithic shape.

7. The field effect transistor as claimed in claim 1, wherein the first field plate comprises a field control electrode provided in a manner spaced from the gate electrode.

8. The field effect transistor as claimed in claim 1, wherein the second field plate shows some overlap with the first field plate, and the second field plate is free from overlapping with the gate electrode.

9. The field effect transistor as claimed in claim 1, wherein, in a cross sectional view in the gate length direction, when an extension width in the gate length direction of the first field plate from an end part of the gate electrode toward the drain electrode is designated as L$fp1$, and a length in the gate length direction of a lower surface of the second field plate is designated as L$fp2$, the formula (I) expressed below is satisfied:

$$0.5 \times Lfp1 \leq Lfp2 \tag{1}.$$

10. The field effect transistor as claimed in claim 1, wherein the gate electrode is provided in a manner in contact with an upper surface of the layer structure made of compound semiconductor, and a contact layer is interposed between the layer structure made of compound semiconductor and the drain electrode;
   the contact layer has a recess structure;
   a first insulating film is provided on the layer structure made of compound semiconductor exposed to a bottom surface of the contact layer;
   the first field plate is provided in a manner in contact with an upper surface of the first insulating film; and
   the second field plate is provided in a manner in contact with a second insulating film for covering a side surface of the first field plate,
   whereby the aforementioned structure is constructed in the following structure:
   in the cross sectional view in the gate length direction, when an extension width in the gate length direction of the first field plate from the gate electrode end part toward the drain electrode is designated as L$fp1$;
   a length in the gate length direction of a lower surface of the second field plate is designated as L$fp2$;
   a distance between the gate electrode and a drain side end part of a recess bottom surface of the contact layer is designated as L$gr$; and
   a thickness of the second insulating film at a side surface of the first field plate is designated as d3, the formulas (1) and (2) described below are satisfied:

$$0.5 \times Lfp1 \leq Lfp2 \tag{1}$$

$$Lfp1 + Lfp2 + d3 \leq 3/5 \times Lgr \tag{2}.$$

11. The field effect transistor as claimed in claim 1, wherein there is employed a structure in which, in the cross sectional view in the gate length direction, when a length in the gate length direction of a lower surface of the second field plate is designated as L$fp2$, and a distance between a lower surface of the second field plate in a region between the first field plate and the gate electrode and the layer structure made of compound semiconductor is designated as d2, the formula (3) described below is satisfied.

$$d2 \leq 0.5 \times Lfp2 \tag{3}.$$

12. The field effect transistor as claimed in claim 1, wherein the layer structure made of compound semiconductor is a layer structure made of III-V compound semiconductor layers comprising As.

13. The field effect transistor as claimed in claim 7, wherein the first field plate is free from overlapping with the gate electrode.

14. The field effect transistor as claimed in claim 1, wherein, in a cross sectional view in the gate length direction, when an extension width in the gate length direction of the first field plate from an end part of the gate electrode toward the drain electrode is designated as L$fp1$, the relation expressed below is satisfied:

$$0 < Lfp1/Lg < Lol/Lg \leq 1.$$

15. The field effect transistor as claimed in claim 1, wherein the relation expressed below is satisfied:

$$0 < Lol/Lg \leq 0.7.$$

16. The field effect transistor as claimed in claim 1, further comprising a contact layer interposed between the layer structure made of compound semiconductor and each of the source electrode and the drain electrode.

17. The field effect transistor as claimed in claim 1, wherein the gate electrode contacts the layer structure made of compound semiconductor and is spaced apart from the contact layer by a first insulating film covering a surface of the layer structure made of compound semiconductor in regions between the gate electrode and the source and electrodes.

* * * * *